United States Patent
Kim et al.

(10) Patent No.: US 10,879,804 B2
(45) Date of Patent: Dec. 29, 2020

(54) SWITCHING REGULATOR FOR DYNAMICALLY CHANGING OUTPUT VOLTAGE AND POWER SUPPLY CIRCUIT INCLUDING THE SWITCHING REGULATOR

(71) Applicant: SAMSUNG ELECTRONICS CO., LTD., Suwon-si (KR)

(72) Inventors: Dong-su Kim, Suwon-si (KR); Jong-beom Baek, Yangju-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 10 days.

(21) Appl. No.: 16/285,390

(22) Filed: Feb. 26, 2019

(65) Prior Publication Data

US 2020/0028435 A1  Jan. 23, 2020

(30) Foreign Application Priority Data

Jul. 23, 2018  (KR) .................. 10-2018-0085380

(51) Int. Cl.
*H02M 3/158* (2006.01)
*G05F 1/575* (2006.01)
*H02M 1/00* (2006.01)

(52) U.S. Cl.
CPC .......... *H02M 3/1584* (2013.01); *G05F 1/575* (2013.01); *H02M 2001/0003* (2013.01)

(58) Field of Classification Search
CPC .......... H02M 3/157–1588; H02M 2001/0025; H02M 2001/0032; H02M 2003/1566; H02M 1/14; H02M 1/00; H03F 1/02; H03F 1/0227; H03F 1/025; G05F 3/08; Y02B 70/16
See application file for complete search history.

(56) References Cited

U.S. PATENT DOCUMENTS

| | | | |
|---|---|---|---|
| 6,518,859 B1 * | 2/2003 | Spampinato | H03H 7/12 333/174 |
| 7,486,060 B1 | 2/2009 | Bennett | |
| 7,576,527 B1 | 8/2009 | Zhang et al. | |
| 7,821,244 B1 | 10/2010 | Signoretti et al. | |

(Continued)

FOREIGN PATENT DOCUMENTS

| | | |
|---|---|---|
| EP | 2 259 161 A2 | 12/2010 |
| JP | 2012-151926 A | 8/2012 |

OTHER PUBLICATIONS

Communication dated Nov. 7, 2019 issued by the European Intellectual Property Office in counterpart European Application No. 19171182.9.

*Primary Examiner* — Thienvu V Tran
*Assistant Examiner* — Nusrat Quddus
(74) *Attorney, Agent, or Firm* — Sughrue Mion, PLLC

(57) ABSTRACT

A switching regulator configured to generate an output voltage based on an input voltage is provided. The switching regulator includes: an inductor; and a capacitor circuit configured to generate the output voltage by charging an inductor current passing through the inductor from the input voltage, provide a first capacitance as a load capacitance based on the output voltage being a first level or a second level, and provide a second capacitance, which is less than the first capacitance, as the load capacitance based on the output voltage being between the first level to the second level.

18 Claims, 12 Drawing Sheets

(56) References Cited

U.S. PATENT DOCUMENTS

| | | |
|---|---|---|
| 8,080,982 B2 | 12/2011 | Lin et al. |
| 8,901,904 B2 | 12/2014 | Caldwell |
| 9,069,365 B2 | 6/2015 | Brown et al. |
| 9,071,128 B2 | 6/2015 | Takida |
| 9,473,019 B2 | 10/2016 | Ripley et al. |
| 2001/0004227 A1* | 6/2001 | Frech ................ H01L 27/0805 333/181 |
| 2004/0007918 A1* | 1/2004 | Clevenger ............ H01L 23/367 307/126 |
| 2008/0001657 A1* | 1/2008 | Zhang ..................... H03H 7/06 327/552 |
| 2008/0012654 A1* | 1/2008 | Han ....................... H03J 3/185 331/167 |
| 2008/0055018 A1* | 3/2008 | Umamichi ............... H03H 7/12 333/181 |
| 2008/0144252 A1* | 6/2008 | Abadeer ................ H03L 7/095 361/277 |
| 2011/0101938 A1 | 5/2011 | Ma et al. |
| 2013/0249505 A1 | 9/2013 | Brown et al. |
| 2014/0084700 A1 | 3/2014 | Anderson et al. |
| 2017/0005691 A1 | 1/2017 | Li et al. |
| 2018/0123516 A1* | 5/2018 | Kim ......................... H03F 1/02 |
| 2018/0152144 A1* | 5/2018 | Choo ................... H04B 1/0483 |

\* cited by examiner

SWITCHING REGULATOR FOR DYNAMICALLY CHANGING OUTPUT VOLTAGE AND POWER SUPPLY CIRCUIT INCLUDING THE SWITCHING REGULATOR

CROSS-REFERENCE TO RELATED APPLICATION

This application claims priority from Korean Patent Application No. 10-2018-0085380, filed on Jul. 23, 2018, in the Korean Intellectual Property Office, the disclosure of which is incorporated by reference herein in its entirety.

BACKGROUND

Methods and apparatuses consistent with example embodiments relate to supply voltage generation, and more particularly, to a switching regulator that dynamically changes an output voltage, and a power supply circuit including the switching regulator.

A supply voltage may be generated to provide power to electronic components. The supply voltage may be required to have reduced noise as well as a level required for operation of an electronic component. In addition, the level of the supply voltage provided to the electronic component may be changed to reduce the power consumption by the electronic component. For example, in the case of a digital circuit that processes a digital signal, a low level supply voltage may be provided when a relatively low performance is required, while a high level supply voltage may be provided when a relatively high performance is required. Thus, a circuit generating the supply voltage may be required to generate a supply voltage capable of quickly changing a level with reduced noise.

SUMMARY

Example embodiments provide a supply voltage that may be quickly changed to a desired level with reduced noise, and a power supply circuit including the switching regulator.

According to an aspect of an example embodiment, there is provided a switching regulator configured to generate an output voltage based on an input voltage and includes: an inductor; and a capacitor circuit configured to generate the output voltage by charging an inductor current passing through the inductor from the input voltage, provide a first capacitance as a load capacitance based on the output voltage being a first level or a second level, and provide a second capacitance, which is less than the first capacitance, as the load capacitance based on the output voltage being between the first level and the second level.

According to an aspect of another example embodiment, there is provided a switching regulator that is configured to generate an output voltage based on an input voltage and includes: an inductor; and a capacitor circuit configured to provide a load capacitance, generate the output voltage by charging an inductor current passing through the inductor from the input voltage, and rapidly change the load capacitance from a first capacitance to a second capacitance that is less than the first capacitance and gradually change the load capacitance from the second capacitance to the first capacitance based on a control signal.

According to an aspect of another example embodiment, there is provided a power supply circuit that is configured to generate a supply voltage based on an input voltage and includes: a first voltage regulator configured to generate a first output voltage based on the input voltage and a reference voltage; a switch configured to change a load capacitance between a ground voltage and the first output voltage based on a control signal; and a power controller configured to generate the reference voltage to control the first voltage regulator to change the first output voltage according to a load condition and generate the control signal to control the switch to maintain the load capacitance at a first capacitance based on the first output voltage being constant and maintain the load capacitance at a second capacitance that is less than the first capacitance based on the first output voltage changing.

According to an aspect of an example embodiment, there is provided a method of operating a switching regulator that is configured to generate an output voltage based on an input voltage. The method includes: maintaining a first capacitance as a load capacitance based on the output voltage being a first level; maintaining the load capacitance as a second capacitance less than the first capacitance based on the output voltage changing from the first level to a second level; and maintaining the load capacitance as the first capacitance based on the output voltage being the second level.

According to an aspect of an example embodiment, there is provided a switching regulator configured to provide an output voltage based on an input voltage, the switching regulator including: a capacitor circuit configured to provide a first capacitance based on a control signal indicating a constant output voltage and provide a second capacitance based on the control signal indicating a changing output voltage; and a controller configured to generate the control signal.

BRIEF DESCRIPTION OF THE DRAWINGS

The above and other aspects, features, and advantages will be more clearly understood from the following detailed description taken in conjunction with the accompanying drawings in which.

DETAILED DESCRIPTION

Figure 1:
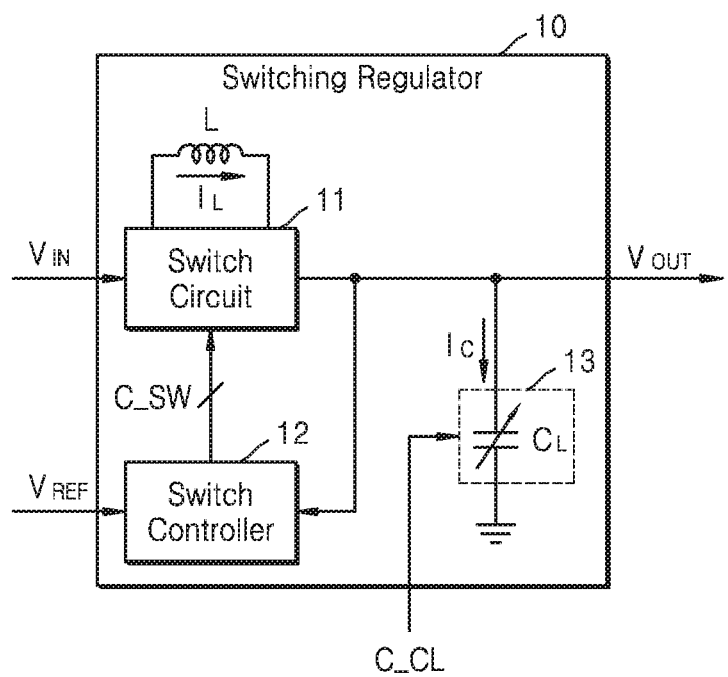
FIG. 1 is a block diagram illustrating a switching regulator according to an example embodiment.

FIG. 1 is a block diagram illustrating a switching regulator 10 according to an example embodiment. The switching regulator 10 may generate an output voltage $V_{OUT}$ based on a reference voltage $V_{REF}$ and an input voltage $V_{IN}$, and the output voltage $V_{OUT}$ may be used as a supply voltage of other electronic components. As illustrated in FIG. 1, the switching regulator 10 may include an inductor L, a switch circuit 11, a switch controller 12, and a capacitor circuit 13. In some example embodiments, components included in the switching regulator 10 may be included in one semiconductor package. In some example embodiments, the switching regulator 10 may include a printed circuit board on which components are mounted.

The switching regulator 10 may generate an output voltage $V_{OUT}$. For example, the switch circuit 11 of the switching regulator 10 may turn the switch on/off on the basis of a switch control signal C_SW provided from the switch controller 12, bypassing the inductor L to switch a path of an inductor current $I_L$. In this specification, the switch on may refer to a state where both ends of the switch are electrically connected, and the switch off may refer to a state where both ends of the switch are electrically disconnected. As described below with reference to FIGS. 3A, 3B and 3C, a DC-DC converter as an example of the switching regulator 10 may generate the output voltage $V_{OUT}$, which is a direct current (DC) voltage from the input voltage $V_{IN}$, which is a DC voltage. Hereinafter, example embodiments will be described mainly with reference to a DC-DC converter as the switching regulator 10. However, it will be appreciated that the example embodiments may be applied to other types of switching regulators 10 such as an AC-DC converter in which the input voltage $V_{IN}$ is an alternating current (AC) voltage.

The switch circuit 11 may receive the switch control signal C_SW from the switch controller 12 and may include at least one switch, which is turned on and off based on the switch control signal C_SW. The switch circuit 11 may control the path of the inductor current $I_L$ flowing from the input voltage $V_{IN}$ through the inductor L based on the switch control signal C_SW. For example, the switch circuit 11 may provide the inductor current $I_L$ to the capacitor circuit 13 to charge a capacitor included in the capacitor circuit 13 in response to the switch control signal C_SW, while it may block the inductor current $I_L$ from being supplied to the capacitor circuit 13 to prevent the overcharge of the capacitor included in the capacitor circuit 13 in response to the switch control signal C_SW. In addition, when there is a load that receives the output voltage $V_{OUT}$ from the switching regulator 10, at least a portion of the inductor current $I_L$ may be provided to the load. Examples of the switch circuit 11 will be described later with reference to FIGS. 3A, 3B and 3C and the like.

The switch controller 12 may generate the switch control signal C_SW based on the reference voltage $V_{REF}$ and the output voltage $V_{OUT}$. For example, the switch controller 12 may include two or more resistors and may generate an output voltage $V_{OUT}$ divided by two or more resistors as a feedback voltage. The switch controller 12 may compare the feedback voltage to the reference voltage $V_{REF}$ and may generate the switch control signal C_SW such that the feedback voltage matches the reference voltage $V_{REF}$. Accordingly, the level of the output voltage $V_{OUT}$ may be determined by the level of the reference voltage $V_{REF}$, and the level of the output voltage $V_{OUT}$ may be changed by changing the level of the reference voltage $V_{REF}$.

The capacitor circuit 13 may include at least one capacitor, and at least one capacitor of the at least one capacitor may be charged or discharged by a capacitor current $I_C$. For example, at least one capacitor of the capacitor circuit 13 may be charged when at least a portion of the inductor current $I_L$ is provided as a capacitor current $I_C$ such that the capacitor current $I_C$ is positive (+). On the other hand, when the capacitor current $I_C$ flows to the ground voltage (or ground) by the switch circuit 11 or flows to the load receiving the output voltage $V_{OUT}$ so that the capacitor current $I_C$ is negative, at least one capacitor of the capacitor circuit 13 may be discharged. As illustrated in FIG. 1, the capacitor circuit 13 may provide a load capacitance $C_L$ between the output voltage $V_{OUT}$ and the ground voltage.

The output voltage $V_{OUT}$ generated by the switching regulator 10 may function as a supply voltage that provides power to the electronic components, and such electronic components may be referred to as the load of the switching regulator 10. For example, the output voltage $V_{OUT}$ may be provided to a digital circuit configured to process a digital signal, an analog circuit configured to process an analog signal, and/or a radio frequency (RF) circuit configured to process an RF signal. The load capacitance $C_L$ may be determined by various requirements. For example, the output voltage $V_{OUT}$ may be required to have reduced noise to prevent malfunction of the load, and in particular it may be required to reduce a ripple due to the switching operation of the switching regulator 10. Accordingly, the load capacitance $C_L$ may be required to have a large value to reduce the ripple of the output voltage $V_{OUT}$. On the other hand, the level of the output voltage $V_{OUT}$ may be dynamically changed to reduce the power consumption of the load, and for example, the switching regulator 10 may be configured to output a low level output voltage $V_{OUT}$, while providing a high level output voltage $V_{OUT}$ when high performance or high power consumption is required at the load. Accordingly, to change the level of the output voltage $V_{OUT}$ quickly and dynamically, the load capacitance $C_L$ may be required to have a small value. According to an example embodiment, as described below with reference to FIGS. 2 and 5, etc., the switching regulator 10 may provide an output voltage $V_{OUT}$ having a level that changes quickly as well as reduced noise.

The capacitor circuit 13 may receive a capacitor control signal C_CL and may provide a load capacitance $C_L$ that varies according to the capacitor control signal C_CL. For example, the capacitor circuit 13 may provide a relatively large load capacitance $C_L$ in response to the capacitor control signal C_CL while the level of the output voltage $V_{OUT}$ is held constant, while the capacitor circuit 13 may provide a relatively low load capacitance $C_L$ in response to the capacitor control signal C_CL while the level of the output voltage $V_{OUT}$ is changed. Thus, the output voltage $V_{OUT}$ may have a level that changes dynamically quickly and has reduced noise. In this specification, the capacitor control signal C_CL for controlling the capacitor circuit 13 may be referred to as a control signal.

Figure 2:
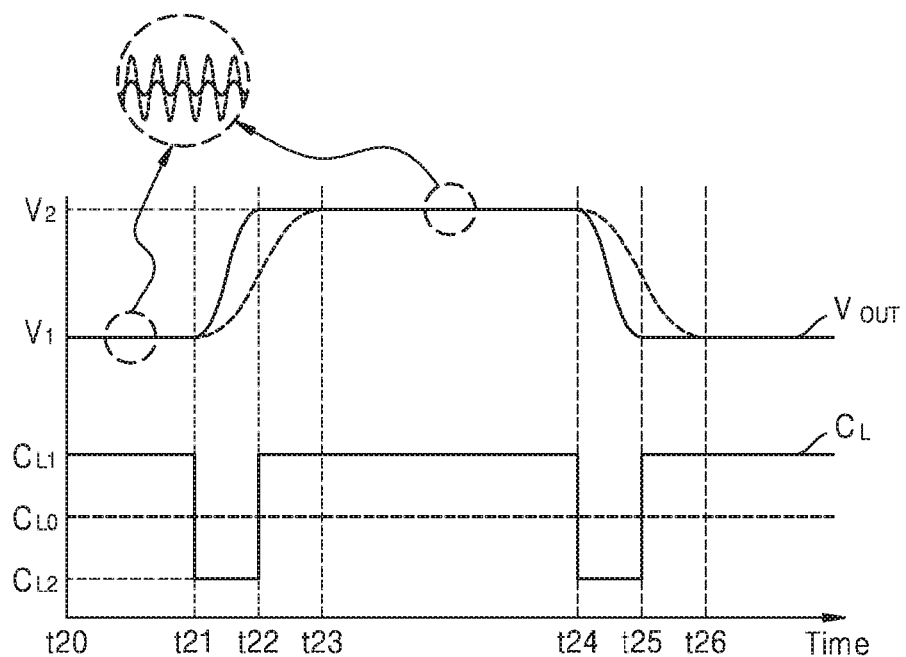
FIG. 2 is a graph illustrating an example of an operation of the switching regulator of FIG. 1 with respect to time, according to an example embodiment.

FIG. 2 is a graph illustrating an example of the operation of the switching regulator 10 of FIG. 1 based on the passage of time, according to an example embodiment. Specifically, FIG. 2 illustrates the output voltage $V_{OUT}$ and the load capacitance $C_L$ of FIG. 1 based on the passage of time in the absence of a load. A dashed line in FIG. 2 illustrates the output voltage $V_{OUT}$ and the load capacitance $C_L$ based on a comparative example in which the load capacitance $C_L$ has a capacitance $C_{L0}$ fixed by the capacitor. Hereinafter, FIG. 2 will be described below with reference to FIG. 1.

Referring to FIG. 2, the capacitor circuit 13 may switch the load capacitance $C_L$ between a relatively high first capacitance $C_{L1}$ and a relatively low second capacitance $C_{L2}$ based on the capacitor control signal C_CL. On the other hand, according to a comparative example, the load capacitance $C_L$ may be kept constant with a fixed capacitance $C_{L0}$ between the first capacitance $C_{L1}$ and the second capacitance $C_{L2}$.

From time t20 to time t21, the output voltage $V_{OUT}$ may be maintained at a first level $V_1$. For example, low performance and/or low power consumption may be required at the load receiving the output voltage $V_{OUT}$, and thus the output voltage $V_{OUT}$ may be maintained at a relatively low first level $V_1$. The capacitor circuit 13 may provide the first capacitance $C_{L1}$ as the load capacitance $C_L$ in response to the capacitor control signal C_CL. In contrast, the load capacitance $C_L$ according to the comparative example is a fixed capacitance $C_{L0}$ lower than the first capacitance $C_{L1}$. Thus, as illustrated in FIG. 2, the switching regulator 10 may generate an output voltage $V_{OUT}$ having a reduced ripple compared to the comparative example from time t20 to time t21. As the charge and discharge are repeated, the capacitor current $I_C$ may oscillate with a constant average.

From time t21 to time t22, the output voltage $V_{OUT}$ may be dynamically changed from a first level $V_1$ to a second level $V_2$. The first level V1 of the output voltage $V_{OUT}$ is lower than the second level V2. For example, high performance and/or high power consumption may be required at the load receiving the output voltage $V_{OUT}$, and thus a period may occur that increases the level of the output voltage $V_{OUT}$. The capacitor circuit 13 may provide the second capacitance $C_{L2}$ as the load capacitance $C_L$ in response to the capacitor control signal C_CL. In contrast, the load capacitance $C_L$ according to the comparative example is a fixed capacitance $C_{L0}$ higher than the second capacitance $C_{L2}$. Accordingly, as illustrated in FIG. 2, the switching regulator 10 may generate the output voltage $V_{OUT}$ having a second level $V_2$ at a relatively early point, i.e., time t22, while the switching regulator 10 according to the comparative example may generate an output voltage $V_{OUT}$ having a second level $V_2$ at a relatively delayed time point, i.e., time t23. In addition, due to the second capacitance $C_{L2}$ being smaller than the fixed capacitance $C_{L0}$ of the comparative example, the capacitor current $I_C$ may have a lower peak value than the comparative example, and thus the magnitude of the peak current passing through the switch circuit 11 and the inductor L may be reduced. Due to the peak value of the reduced inductor current $I_L$, as a result, operational reliability of the switching regulator 10 may be improved. Also, the size of the switch circuit 11 and the inductor L may be reduced.

From time t22 to time t24, the output voltage $V_{OUT}$ may be maintained at the second level $V_2$. The capacitor circuit 13 may provide the first capacitance $C_{L1}$ as the load capacitance $C_L$ in response to the capacitor control signal C_CL. In contrast, the load capacitance $C_L$ according to the comparative example is a fixed capacitance $C_{L0}$ lower than the first capacitance $C_{L1}$. Thus, as illustrated in FIG. 2, the switching regulator 10 may generate an output voltage $V_{OUT}$ having a reduced ripple compared to the comparative example during the period from time t22 to time t23, similar to during the period from time t20 to time t21. As the charge and discharge are repeated, the capacitor current $I_C$ may oscillate with a constant average.

From time t24 to time t25, the output voltage $V_{OUT}$ may be dynamically changed from the second level $V_2$ to the first level $V_1$. For example, a load that receives the output voltage $V_{OUT}$ may be required to be low in performance and/or power consumption, and thus a period in which the level of the output voltage $V_{OUT}$ is reduced may occur. The capacitor circuit 13 may provide the second capacitance $C_{L2}$ as the load capacitance $C_L$ in response to the capacitor control signal C_CL while the load capacitance $C_L$ according to the comparative example is a fixed capacitance $C_{L0}$ higher than the second capacitance $C_{L2}$. Accordingly, as illustrated in FIG. 2, the switching regulator 10 may generate the output voltage $V_{OUT}$ having the first level $V_1$ at a relatively early point in time t25, while an output voltage $V_{OUT}$ may have the first level $V_1$ at a relatively delayed time, i.e., at time t26, according to the comparative example.

From time t25, the output voltage $V_{OUT}$ may be maintained at the first level $V_1$. The capacitor circuit 13 may provide the first capacitance $C_{L1}$ as the load capacitance $C_L$ in response to the capacitor control signal C_CL, while the load capacitance $C_L$ according to the comparative example is a fixed capacitance $C_{L0}$ lower than the first capacitance. Accordingly, similar to the period from time t20 to time t21, the switching regulator 10 may generate an output voltage $V_{OUT}$ having a reduced ripple from the time t25 than the comparative example. As the charge and discharge are repeated, the capacitor current $I_C$ may oscillate with a constant average.

Although the output voltage $V_{OUT}$ in the example of FIG. 2 is illustrated as having one of two different levels, that is, a first level $V_1$ and a second level $V_2$, in some example embodiments, the output voltage $V_{OUT}$ may be selectively controlled to three or more different levels. In addition, in the example of FIG. 2, the load capacitance $C_L$ has been illustrated to have one of two different capacitances, a first capacitance $C_{L1}$ and a second capacitance $C_{L2}$, but in some example embodiments the capacitor circuit 13 may provide a load capacitance $C_L$ having one of three or more different values based on a level of the output voltage $V_{OUT}$.

Figure 3A:
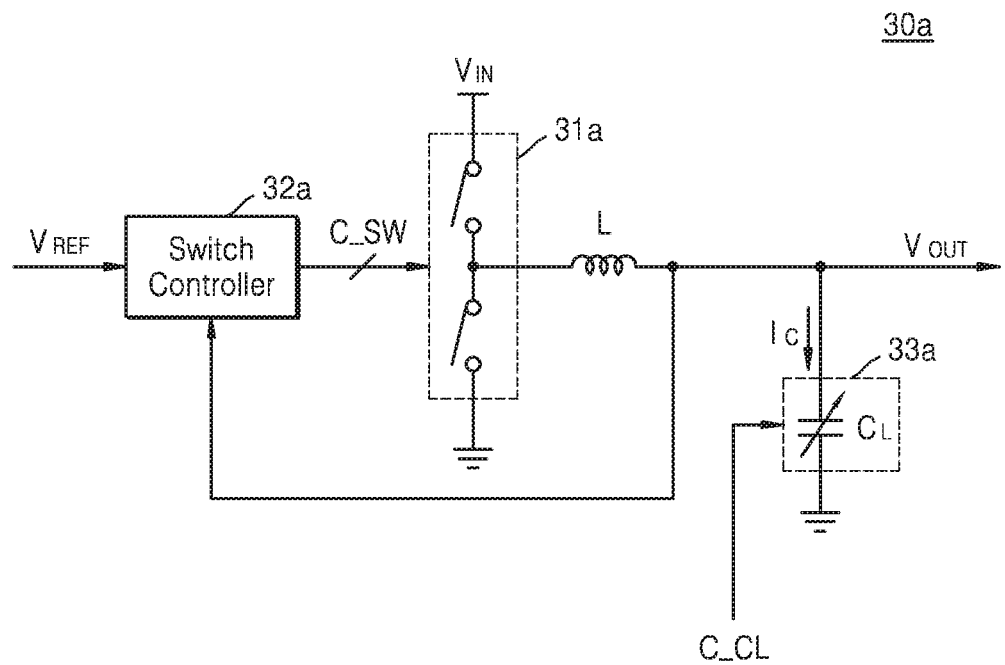
FIGS. 3A, 3B and 3C illustrate examples of switching regulators according to example embodiments.
Figure 3B:
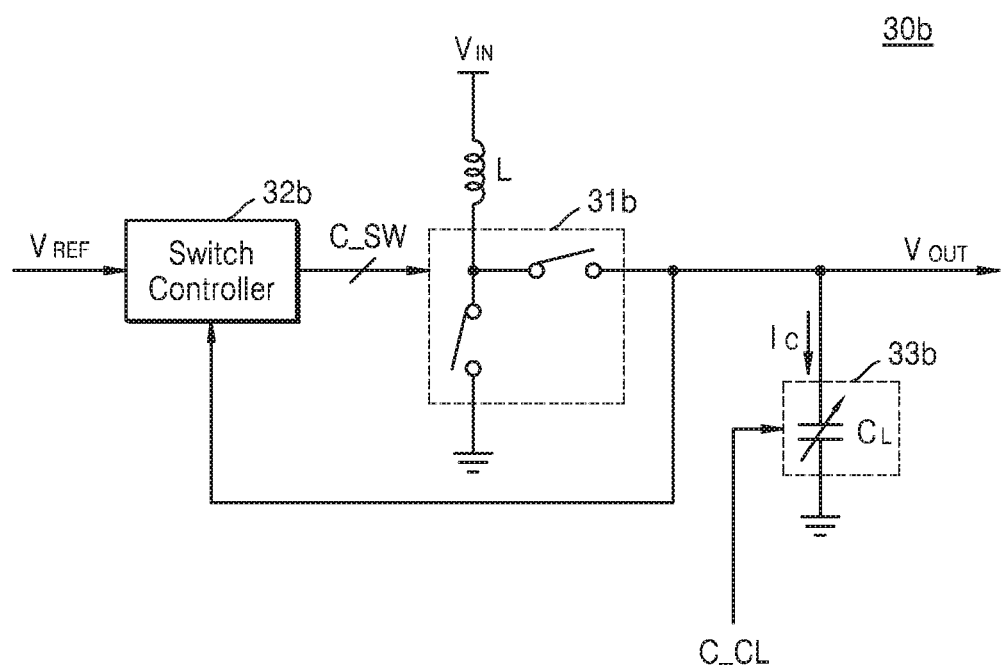
Figure 3C:
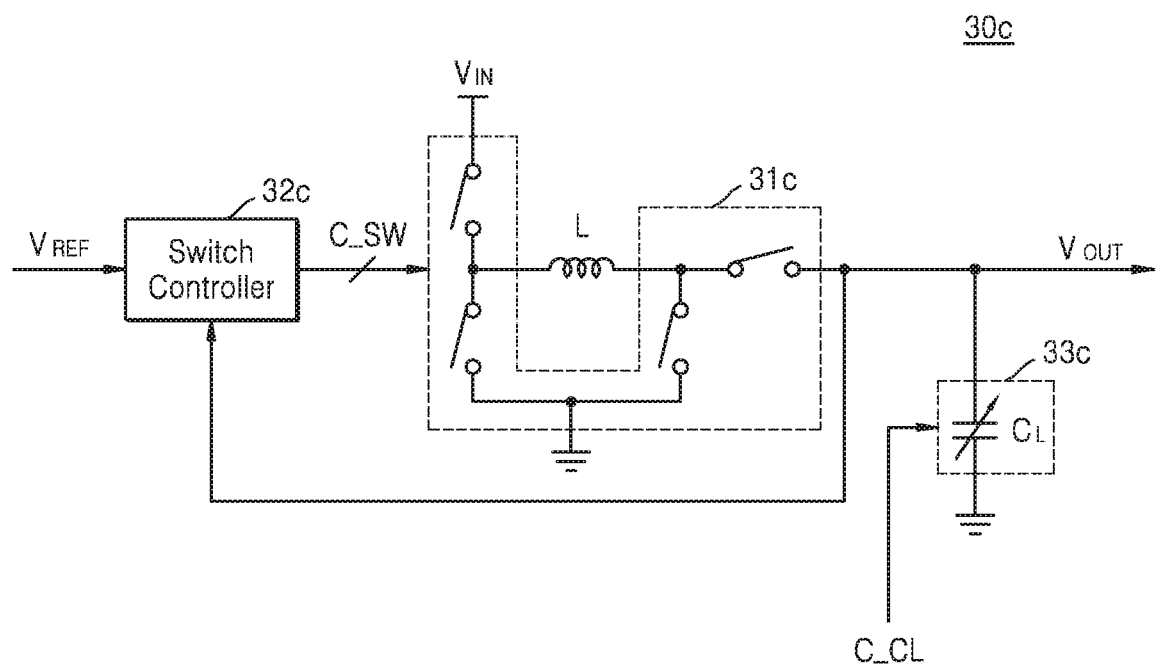

FIGS. 3A, 3B and 3C illustrate examples of switching regulators according to example embodiments. Specifically, FIGS. 3A, 3B and 3C illustrate a buck converter 30a, a boost converter 30b, and a buck-boost converter 30c as examples of a DC-DC converter. Hereinafter, redundant contents among the descriptions of FIGS. 3A, 3B and 3C will be omitted.

Referring to FIG. 3A, the buck converter 30a may function as a step-down converter and generate an output voltage $V_{OUT}$ at a level lower than a level of the input voltage $V_{IN}$. As illustrated in FIG. 3A, the buck converter 30a may include an inductor L, a switch circuit 31a, a switch controller 32a, and a capacitor circuit 33a. The switch controller 32a may generate a switch control signal C_SW based on a reference voltage $V_{REF}$ and an output voltage $V_{OUT}$ to provide the switch control signal C_SW to the switch circuit 31a. When the level of the reference voltage $V_{REF}$ is changed, the switch controller 32a may generate the switch control signal C_SW based on the level of the reference voltage $V_{REF}$ and the output voltage $V_{OUT}$ of the changed level. The switch circuit 31a may include two switches connected in series between the input voltage $V_{IN}$ and the ground voltage. In some example embodiments, the switch circuit 31a may mutually exclusively turn on the two switches in response to the switch control signal C_SW. The capacitor circuit 33a may provide a load capacitance $C_L$ that varies according to the capacitor control signal C_CL, between the output voltage $V_{OUT}$ and the ground voltage.

Referring to FIG. 3B, the boost converter 30b may function as a step-up converter and generate an output voltage $V_{OUT}$ at a level higher than the level of the input voltage $V_{IN}$. As illustrated in FIG. 3B, the boost converter 30b may include an inductor L, a switch circuit 31b, a switch controller 32b, and a capacitor circuit 33b. The switch controller 32b may generate a switch control signal C_SW based on a reference voltage $V_{REF}$ and an output voltage $V_{OUT}$ to provide the switch control signal C_SW to the switch circuit 31b. When a level of the reference voltage $V_{REF}$ is changed, the switch controller 32b may generate the switch control signal C_SW based on levels of the changed reference voltage $V_{REF}$ and the changed output voltage $V_{OUT}$. The switch circuit 31b may include two switches electrically connecting an end of the inductor L to the output voltage $V_{OUT}$ and the ground voltage respectively. In some example embodiments, the switch circuit 31b may mutually exclusively turn on the two switches in response to the switch control signal C_SW. The capacitor circuit 33b may provide a load capacitance $C_L$ that varies according to the capacitor control signal C_CL, between the output voltage $V_{OUT}$ and the ground voltage.

Referring to FIG. 3C, the buck-boost converter 30c may generate an output voltage $V_{OUT}$ having a level higher or lower than a level of the input voltage $V_{IN}$, and may include an inductor L, a switch circuit 31c, a switch controller 32c, and a capacitor circuit 33c. The switch controller 32c may generate a switch control signal C_SW such that the buck-boost converter 30c operates as the buck converter 30a of FIG. 3A or the boost converter 30b of FIG. 3B based on a level of the output voltage $V_{OUT}$. For example, when the level of the output voltage $V_{OUT}$ is lower than the level of the input voltage $V_{IN}$, the switch controller 32c may generate the switch control signal C_SW such that the buck-boost converter 30c has the same structure as the buck converter 30a of FIG. 3A using switches included in the switch circuit 31c. On the other hand, when the level of the output voltage $V_{OUT}$ is higher than the level of the input voltage $V_{IN}$, the switch controller 32c may generate the switch control signal C_SW such that the buck-boost converter 30c has the same structure as the boost converter 30b of FIG. 3B using the switches included in the switch circuit 31c. In addition, the switch controller 32c may generate the switch control signal C_SW based on the reference voltage $V_{REF}$ and the output voltage $V_{OUT}$.

The switch circuit 31c may include two switches connected in series between the input voltage $V_{IN}$ and the ground voltage, and two switches electrically connecting an end of the inductor L to the output voltage $V_{OUT}$ and the ground voltage respectively. The capacitor circuit 33c may provide a load capacitance $C_L$ that varies according to the capacitor control signal C_CL, between the output voltage $V_{OUT}$ and the ground voltage.

Figure 4:
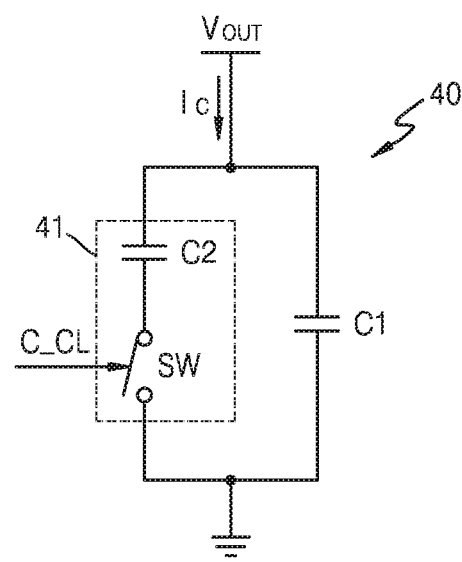
FIG. 4 is a circuit diagram illustrating an example of a capacitor circuit of FIG. 1 according to an example embodiment.

FIG. 4 is a circuit diagram illustrating an example of the capacitor circuit 13 of FIG. 1 according to an example embodiment. As described above with reference to FIG. 1, a capacitor circuit 40 of FIG. 4 may provide a load capacitance $C_L$ that varies according to the capacitor control signal C_CL between an output voltage $V_{OUT}$ and a ground voltage. As illustrated in FIG. 4, the capacitor circuit 40 may include a first capacitor C1 having a fixed capacitance and a variable capacitor 41 connected in parallel with the first capacitor C1. Hereinafter, FIG. 4 will be described with reference to FIGS. 1 and 2.

The variable capacitor 41 may include a second capacitor C2 and a switch SW connected in series with each other, and the switch SW may be turned on and off according to the capacitor control signal C_CL. In some example embodiments, the switch SW may remain on while the output voltage $V_{OUT}$ is maintained at a constant level, while the switch SW may remain off while a level of the output voltage $V_{OUT}$ changes. When the switch SW is turned on, the first capacitor C1 and the second capacitor C2 may be electrically connected in parallel, and the capacitor circuit 40 may provide a load capacitance $C_L$ corresponding to a sum of a capacitance of the first capacitor C1 and a capacitance of the second capacitor C2. On the other hand, when the switch SW is turned off, the capacitor circuit 40 may provide the load capacitance $C_L$ corresponding to the capacitance of the first capacitor C1. For example, as described above with reference to FIG. 2, when the capacitor circuit 40 is capable of providing either one of two different load capacitances, that is, a first capacitance $C_{L1}$ or a second capacitance $C_{L2}$, the first capacitor C1 may have the second capacitance $C_{L2}$ while the second capacitor C2 may have a capacitance corresponding to a difference $C_{L1}-C_{L2}$ between the first capacitance $C_{L1}$ and the second capacitance $C_{L2}$.

In some example embodiments, the capacitor circuit 40 may rapidly change the load capacitance $C_L$ from the first capacitance $C_{L1}$ to the second capacitance $C_{L2}$ in response to the capacitor control signal C_CL, while the load capacitance $C_L$ may be gradually changed from the second capacitance $C_{L2}$ to the first capacitance $C_{L1}$. That is, the capacitor circuit 40 may rapidly reduce the load capacitance $C_L$ at a point in time when the level of the output voltage $V_{OUT}$ starts to be changed, and gradually increase the load capacitance $C_L$ at a point in time when the level of the output voltage $V_{OUT}$ is completely changed. Thus, not only the level of the output voltage $V_{OUT}$ may be rapidly changed, but also the fluctuation of the output voltage $V_{OUT}$ that occurs due to the increase in the load capacitance $C_L$ may be suppressed again. To this end, in some example embodiments, a switch SW included in a variable capacitor 41 may operate differently in each of the turn-on and turn-off in response to the capacitor control signal C_CL. Examples of the variable capacitor 41 will be described later with reference to FIGS. 6A, 6B and 6C.

Figure 5:
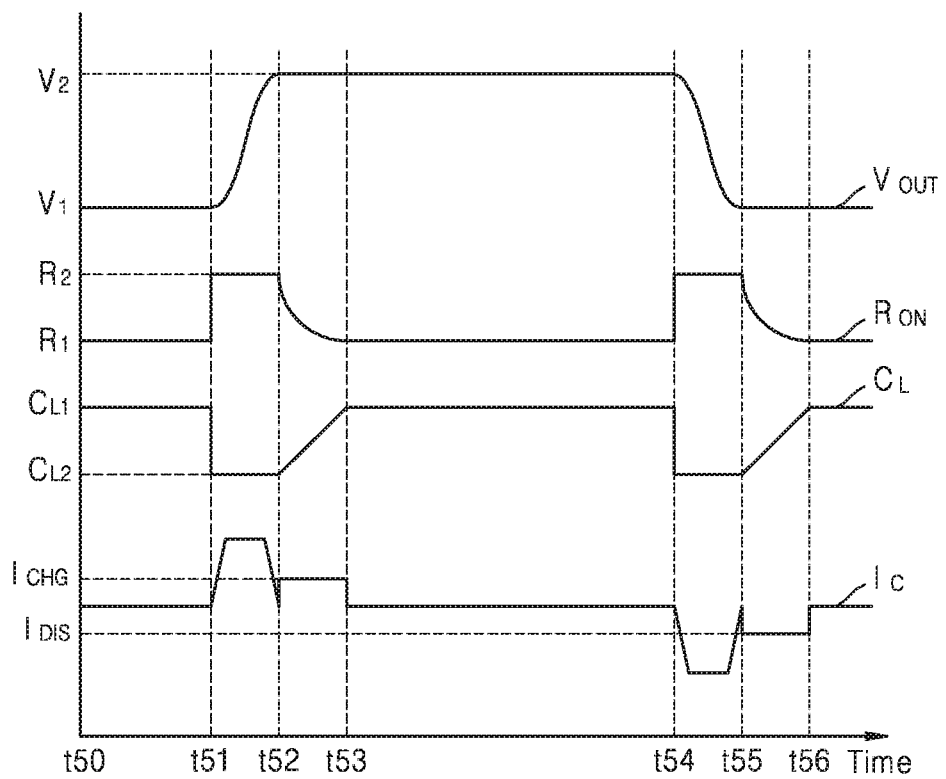
FIG. 5 is a graph illustrating an example of an operation of the switching regulator of FIG. 1 based on the passage of time according to an example embodiment.

FIG. 5 is a graph illustrating an example of an operation of the switching regulator 10 of FIG. 1 based on the passage of time according to an example embodiment. Specifically, FIG. 5 illustrates an example where the switching regulator 10 includes the capacitor circuit 40 of FIG. 4. FIG. 5 illustrates an ON resistance $R_{ON}$ and a capacitor current $I_C$ of the switch SW in FIG. 4 based on the passage of time. As described above with reference to FIG. 4, in the example of FIG. 5, the load capacitance $C_L$ may be rapidly reduced and gradually increased. Hereinafter, FIG. 5 will be described with reference to FIGS. 1 and 4, and description overlapping with FIG. 2 in the description of FIG. 5 will be omitted.

From time t50 to time t51, the output voltage $V_{OUT}$ may be maintained at a first level $V_1$. The capacitor circuit 40 may provide a first capacitance $C_{L1}$ as the load capacitance $C_L$ in response to the capacitor control signal C_CL. To provide the capacitance of the second capacitor C2 as a part of the load capacitance $C_L$, the switch SW may be in an on state and may have a relatively low first resistance value $R_1$. In some example embodiments, the first resistance value $R_1$ may be approximately zero. As described above with reference to FIG. 2, the ripple at the output voltage $V_{our}$ may be reduced due to a relatively high first capacitance $C_{L1}$.

From time t51 to time t52, the output voltage $V_{OUT}$ may be dynamically changed from the first level $V_1$ to a second level $V_2$. The capacitor circuit 40 may rapidly change the load capacitance $C_L$ from the first capacitance $C_{L1}$ to the second capacitance $C_{L2}$ at time t51 in response to the capacitor control signal C_CL and may maintain the load capacitance $C_L$ as the second capacitance $C_{L2}$ until time t52. At time t51, to exclude the capacitance of the second capacitor C2 from the load capacitance $C_L$, the switch SW may be turned off, as illustrated in FIG. 5, the ON resistance $R_{ON}$ of the switch SW may be changed rapidly from the first resistance value $R_1$ to a second resistance value $R_2$ which is relatively high and may be maintained at the second resistance value $R_2$ until time t52. In some example embodiments, the second resistance value $R_2$ may be approximately infinite. Thus, as described above with reference to FIG. 2, the output voltage $V_{OUT}$ due to the relatively low second capacitance $C_{L2}$ may have a second level $V_2$ at a point in earlier time, that is, time t52. As illustrated in FIG. 5, from time t51 to time t52, a capacitor current $I_C$ for charging the capacitor circuit 40 may be provided to the capacitor circuit 40 due to a level of the increased output voltage $V_{OUT}$.

At time t52, the output voltage $V_{OUT}$ may reach a second level $V_2$ and the capacitor circuit 40 may begin to gradually change the load capacitance $C_L$ from the second capacitance $C_{L2}$ to the first capacitance $C_{L1}$ in response to the capacitor control signal C_CL. The capacitor circuit 40 may gradually change the load capacitance $C_L$ until the time t53 when the load capacitance $C_L$ reaches the first capacitance $C_{L1}$. Although the load capacitance $C_L$ has been illustrated to increase linearly from time t52 to time t53 in FIG. 5, in some example embodiments the load capacitance $C_L$ may be increased non-linearly from time t52 to time t53.

To gradually change the load capacitance $C_L$ from the second capacitance $C_{L2}$ to the first capacitance $C_{L1}$, the switch SW may be gradually changed from an OFF state to an ON state, that is, the ON resistance $R_{ON}$ may be gradually changed from the second resistance value $R_2$ to the first resistance value $R_1$. In addition, due to the load capacitance $C_L$ gradually increasing from the second capacitance $C_{L2}$ to the first capacitance $C_{L1}$ and the output voltage $V_{OUT}$ of the second level $V_2$ raised from the first level $V_1$, a capacitor current $I_C$ for charging the variable capacitor 41 of the capacitor circuit 40 may be generated. In some example embodiments, as illustrated in FIG. 5, the capacitor current $I_C$ may have a constant magnitude $I_{CHG}$ from time t52 to time t53.

From time t53 to time t54, the output voltage $V_{OUT}$ may be maintained at the second level $V_2$. The capacitor circuit 40 may provide the first capacitance $CL_1$ as the load capacitance $C_L$ in response to the capacitor control signal C_CL. To provide the capacitance of the second capacitor C2 as a part of the load capacitance $C_L$, the switch SW may be in an on state and may have a relatively low first resistance value $R_1$. Similarly from time t50 to time t51, the ripple at the output voltage $V_{OUT}$ may be reduced due to the relatively high first capacitance $C_{L1}$.

From time t54 to time t55, the output voltage $V_{OUT}$ may be dynamically changed from the second level $V_2$ to the first level $V_1$. The capacitor circuit 40 may rapidly change the load capacitance $C_L$ from the first capacitance $C_{L1}$ to the second capacitance $C_{L2}$ at time t54 in response to the capacitor control signal C_CL, and may maintain the second capacitance $C_{L2}$ as the load capacitance $C_L$ until time t55. At time t54, the ON resistance $R_{ON}$ of the switch SW may be changed rapidly from the first resistance value $R_1$ to the second resistance value $R_2$ and may be maintained at the second resistance value $R_2$ until time t55. Thus, due to the relatively low second capacitance $C_{L2}$, the output voltage $V_{OUT}$ may have a first level $V_1$ at a point in earlier time, i.e., at time t55. As illustrated in FIG. 5, from time t54 to time t55, a capacitor current $I_C$ for discharging the capacitor circuit 40 may be provided to the capacitor circuit 40 due to a level of the reduced output voltage $V_{OUT}$.

At time t55, the output voltage $V_{OUT}$ may reach a first level $V_1$ and the capacitor circuit 40 may start to gradually change the load capacitance $C_L$ from the second capacitance $C_{L2}$ to the first capacitance $C_{L1}$ in response to the capacitor control signal C_CL. The capacitor circuit 40 may gradually change the load capacitance $C_L$ until the time t56 when the load capacitance $C_L$ reaches the first capacitance $C_{L1}$. The load capacitance $C_L$ may increase linearly in some example embodiments and may increase non-linearly in other example embodiments. The ON resistance $R_{ON}$ of the switch SW may be gradually changed from the second resistance value $R_2$ to the first resistance value $R_1$. In addition, due to the load capacitance $C_L$ gradually increasing from the second capacitance $C_{L2}$ to the first capacitance $C_{L1}$ and the output voltage $V_{OUT}$ of the first level $V_1$ lowered from the second level $V_2$, a capacitor current $I_C$ may be generated for discharging the variable capacitor 41 of the capacitor circuit 40. In some example embodiments, as illustrated in FIG. 5, the capacitor current $I_C$ may have a constant magnitude $I_{DIS}$ from time t55 to time t56.

From time t56, the output voltage $V_{OUT}$ may be maintained at the first level $V_1$. The capacitor circuit 40 may provide the first capacitance $C_{L1}$ as the load capacitance $C_L$ in response to the capacitor control signal C_CL and the switching regulator 10 may provide the output voltage $V_{OUT}$ with the reduced ripple.

Figure 6A:
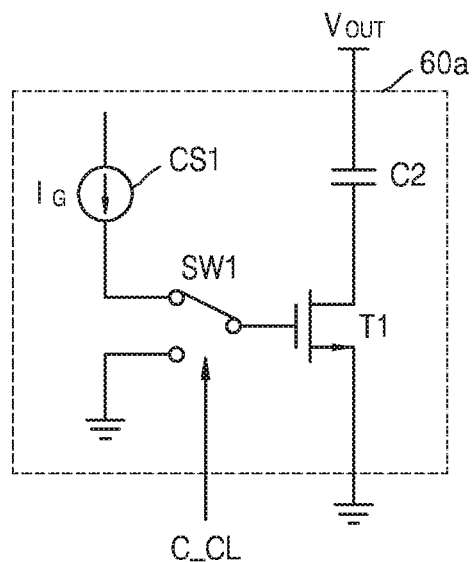
FIGS. 6A, 6B and 6C illustrate examples of variable capacitors according to example embodiments.
Figure 6B:
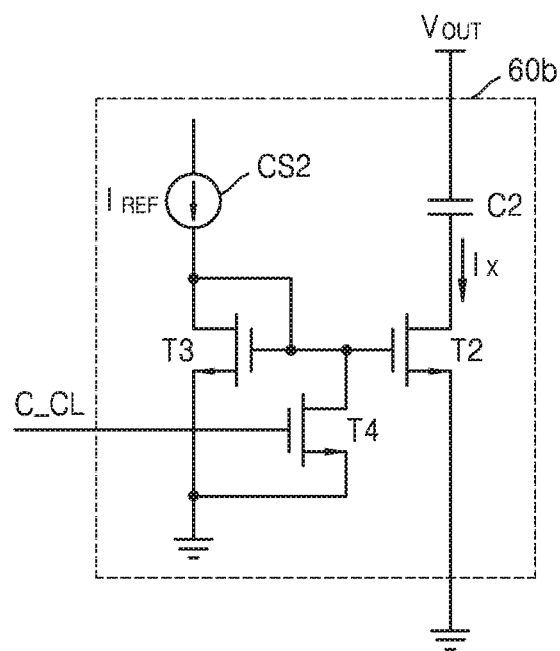
Figure 6C:
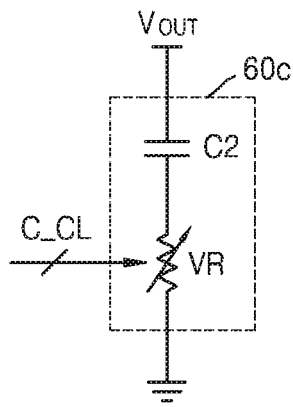

FIGS. 6A, 6B and 6C are diagrams illustrating examples of variable capacitors according to example embodiments. As described above with reference to FIG. 4, variable capacitors 60a, 60b, and 60c of FIGS. 6A, 6B and 6C may have variable capacitances based on the capacitor control signal C_CL, respectively. In addition, as described above with reference to FIG. 5, in some example embodiments, the variable capacitors 60a, 60b, and 60c of FIGS. 6A, 6B and 6C may be arranged such that a capacitance of the second capacitor C2 is rapidly excluded from the load capacitance $C_L$ and may operate such that the capacitance of the second capacitor C2 is gradually added to the load capacitance $C_L$.

Referring to FIG. 6A, the variable capacitor 60a may include a second capacitor C2, a current source CS1, a single pole double throw (SPDT) switch SW1, and a first transistor T1. The first transistor T1 may include an NMOS transistor having a drain connected to the second capacitor C2, a source to which a ground voltage is applied, and a gate connected to the SPDT switch SW1. The current source CS1 may generate a current $I_G$ and the SPDT switch SW1 may connect a gate of the first transistor T1 to the current source CS1 or to a ground node based on the capacitor control signal C_CL.

For a reduced load capacitance $C_L$ (e.g., a second capacitance $C_{L2}$), the SPDT switch SW1 may connect the gate of the first transistor T1 to a ground node in response to, for example, a high-level capacitor control signal C_CL. Accordingly, the first transistor T1 may be turned off, and thus a capacitance of the second capacitor C2 may be rapidly excluded from the load capacitance $C_L$. On the other hand, for the increased load capacitance $C_L$ (e.g., the first capacitance $C_{L1}$), the SPDT switch SW1 may couple the gate of the first transistor T1 to the current source CS1 in response to, for example, a low-level capacitor control signal C_CL.

Accordingly, the gate voltage of the first transistor T1 may be raised by the current $I_G$, and thus a source-drain resistance of the first transistor T1 may be reduced. As a result, the capacitance of the second capacitor C2 may be gradually added to the load capacitance $C_L$. The rate at which the capacitance of the variable capacitor 60a increases in response to the low level capacitor control signal C_CL may be determined by the current of the current source CS1 and a parasitic capacitance which is the gate of the first transistor T1, and in some example embodiments, the variable capacitor 60a may further include a capacitor coupled between the gate of the first transistor T1 and the ground node.

Referring to FIG. 6B, the variable capacitor 60b may include a second capacitor C2, a current source CS2, and a plurality of transistors, for example, second to fourth transistors T2 to T4. The second transistor T2 may include a drain connected to the second capacitor C2, a source to which a ground voltage is applied, and a gate connected to the third transistor T3 and the fourth transistor T4. The current source CS2 may generate a reference current $I_{REF}$, and the third transistor T3 and the second transistor T2 may form a current mirror while the fourth transistor T4 is turned off. Accordingly, a current $I_X$ flowing through the drain and the source of the second transistor T2 may be determined by the reference current $I_{REF}$ and a size ratio of the third transistor T3 and the second transistor T2.

The fourth transistor T4 may apply a ground voltage to a gate of the second transistor T2 in response to the capacitor control signal C_CL of a high level for the reduced load capacitance $C_L$ (e.g., the second capacitance $C_{L2}$). Accordingly, the second transistor T2 may be turned off, and thus the capacitance of the second capacitor C2 may be rapidly excluded from the load capacitance $C_L$. On the other hand, the fourth transistor T4 may be turned off in response to the capacitor control signal C_CL of a low level for an increased load capacitance $C_L$ (e.g., the first capacitance $C_{L1}$). Accordingly, the gate voltage of the second transistor T2 and the third transistor T3 may be gradually increased, and thus the capacitance of the second capacitor C2 may be gradually added to the load capacitance $C_L$ by drawing the current $I_X$ from the second capacitor C2.

Referring to FIG. 6C, the variable capacitor 60c may include a second capacitor C2 and a variable resistor VR that are connected in series with each other. The variable resistor VR may provide a variable resistance value between the second capacitor C2 and a ground potential based on the capacitor control signal C_CL. For example, the variable resistor VR may provide a relatively high resistance value (e.g., approximately infinite) for a reduced load capacitance $C_L$ (e.g., second capacitance $C_{L2}$), while the variable resistor VR may provide a relatively low resistance value (e.g., approximately zero) for an increased load capacitance $C_L$ (e.g., the first capacitance $C_{L1}$).

In some example embodiments, the variable resistor VR may provide a resistance value that increases rapidly in response to the capacitor control signal C_CL for a load capacitance $C_L$ that is rapidly reduced, while a resistance value that decreases gradually may be provided for gradually increasing the load capacitance $C_L$. For example, the variable resistor VR may include a plurality of subcircuits, each including a resistor and an NMOS transistor connected in series with each other, and the plurality of subcircuits may be connected in parallel between the second capacitor C2 and the ground node. The capacitor control signal C_CL may include a plurality of bits provided to each of the subcircuits. The capacitor control signal C_CL may be rapidly varied such that all bits have a low level for a rapidly increased resistance, while the capacitor control signal C_CL may be sequentially changed until all bits have a high level for a gradually decreasing resistance value.

Figure 7:
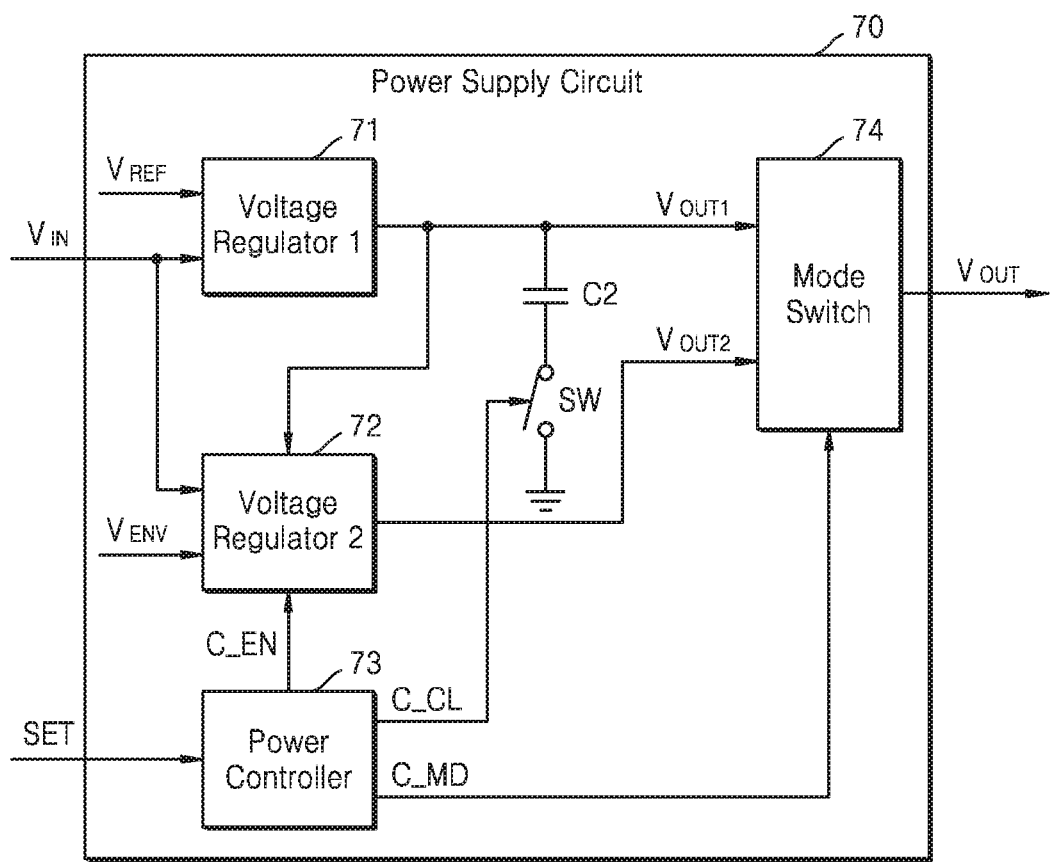
FIG. 7 is a block diagram illustrating a power supply circuit according to an example embodiment.

FIG. 7 is a block diagram illustrating a power supply circuit 70 according to an example embodiment. As illustrated in FIG. 7, the power supply circuit 70 may generate an output voltage $V_{OUT}$ from an input voltage $V_{IN}$ and may receive a set signal SET. In some example embodiments, as illustrated in FIG. 7, at least one of a reference voltage $V_{REF}$ and an envelope voltage $V_{ENV}$ may be generated within the power supply circuit 70 (e.g., by a power controller 73). In other example embodiments, at least one of the reference voltage $V_{REF}$ and the envelope voltage $V_{ENV}$ may be received from outside the power supply circuit 70. The power supply circuit 70 may include a second capacitor C2, a switch SW, a first voltage regulator 71, a second voltage regulator 72, the power controller 73, and a mode switch 74.

The first voltage regulator 71 may generate a first output voltage $V_{OUT1}$ from the input voltage $V_{IN}$ based on the reference voltage $V_{REF}$. For example, the first voltage regulator 71 may be a DC-DC converter illustrated with reference to FIGS. 3A, 3B and 3C, and a level of the first output voltage $V_{OUT1}$ may be determined according to a level of the reference voltage $V_{REF}$. The switch SW may change the load capacitance $C_L$ between the first output voltage $V_{OUT1}$ and the ground voltage based on the capacitor control signal C_CL. Similar to the variable capacitor 41 of FIG. 4, when the switch SW is turned on in response to the capacitor control signal C_CL, the second capacitor C2 may contribute to the load capacitance $C_L$, while the second capacitor C2 may be excluded from the load capacitance $C_L$ when the switch SW is turned off in response to the capacitor control signal C_CL.

The second voltage regulator 72 may generate a second output voltage $V_{OUT2}$ from the input voltage $V_{IN}$ based on the envelope voltage $V_{ENV}$. For example, the second voltage regulator 72 may include the DC-DC converter illustrated with reference to FIGS. 3A, 3B and 3C and may further include a circuit (e.g., a linear regulator) that adjusts a magnitude of the second output voltage $V_{OUT2}$ according to the envelope voltage $V_{ENV}$. The envelope voltage $V_{ENV}$ may be a signal whose magnitude depends on the power consumption required at the load and may have, for example, a magnitude that follows the envelope of the swinging output signal of the load. Accordingly, the second output voltage $V_{OUT2}$ may have a magnitude corresponding to the power consumption required in the load. As illustrated in FIG. 7, in some example embodiments, the second voltage regulator 72 may receive the first output voltage $V_{OUT1}$ from the first voltage regulator 71, and at least some of the components included in the second voltage regulator 72 may be powered from the first output voltage $V_{OUT1}$. Examples of the first voltage regulator 71 and the second voltage regulator 72 will be described below with reference to FIGS. 8 and 10.

The mode switch 74 may output one of the first output voltage $V_{OUT1}$ and the second output voltage $V_{OUT2}$ as the output voltage $V_{OUT}$ based on a mode control signal C_MD provided from the power controller 73. For example, the mode control signal C_MD may indicate an average power tracking (APT) mode or an envelope tracking (ET) mode, and the mode switch 74 may output the first output voltage $V_{OUT1}$ as the output voltage $V_{OUT}$ in response to the mode control signal C_MD indicating the average power tracking mode, while the mode switch 74 may output the second output voltage $V_{OUT2}$ as the output voltage $V_{OUT}$ in response to the mode control signal C_MD indicating the envelope tracking mode. In some example embodiments, the mode switch 74 may include at least one power switch, and the power switch may include a power transistor capable of supporting a high current.

The power controller 73 may receive a set signal SET from the power supply circuit 70 to generate a plurality of control signals C_CL, C_MD, and C_EN based on the set signal SET. For example, the set signal SET may include information indicating an average power tracking mode or an envelope tracking mode and may also include information that dynamically changes a level of the first output voltage $V_{OUT1}$. In some example embodiments, the power controller 73 may further generate a reference voltage $V_{REF}$ and/or an envelope voltage $V_{ENV}$.

In some example embodiments, the power controller 73 may provide an inactive enable signal C_EN to the second voltage regulator 72 when the set signal SET indicates an average power tracking mode and may provide a mode control signal C_MD to the mode switch 74 such that the first output voltage $V_{OUT1}$ is output as the output voltage $V_{OUT}$. The second voltage regulator 72 may be disabled in response to the deactivated enable signal C_EN, and for example, the disabled second voltage regulator 72 may be powered down. On the other hand, the power controller 73 may provide an active enable signal C_EN to the second voltage regulator 72 when the set signal SET indicates the envelope tracking mode and may provide a mode control signal C_MD to the mode switch 74 that causes the second output voltage $V_{OUT2}$ to be output as the output voltage $V_{OUT}$. The second voltage regulator 72 may generate the second output voltage $V_{OUT2}$ from the input voltage $V_{IN}$ based on the envelope voltage $V_{ENV}$ in response to an active enable signal C_EN.

In some example embodiments, the power controller 73 may provide the switch SW with a capacitor control signal C_CL that turns off the switch SW when the set signal SET indicates a change in the level of the first output voltage $V_{OUT1}$. Accordingly, the second capacitor C2 may not contribute to the load capacitance $C_L$ of the first voltage regulator 71, and the load capacitance $C_L$ may decrease. In addition, the power controller 73 may provide the switch SW with a capacitor control signal C_CL that turns on the switch SW when the first output voltage $V_{OUT1}$ has been changed to a required level. Thus, the first output voltage $V_{OUT1}$ may be quickly changed to a different level with a reduced ripple at the same time as when a constant level is maintained.

Figure 8:
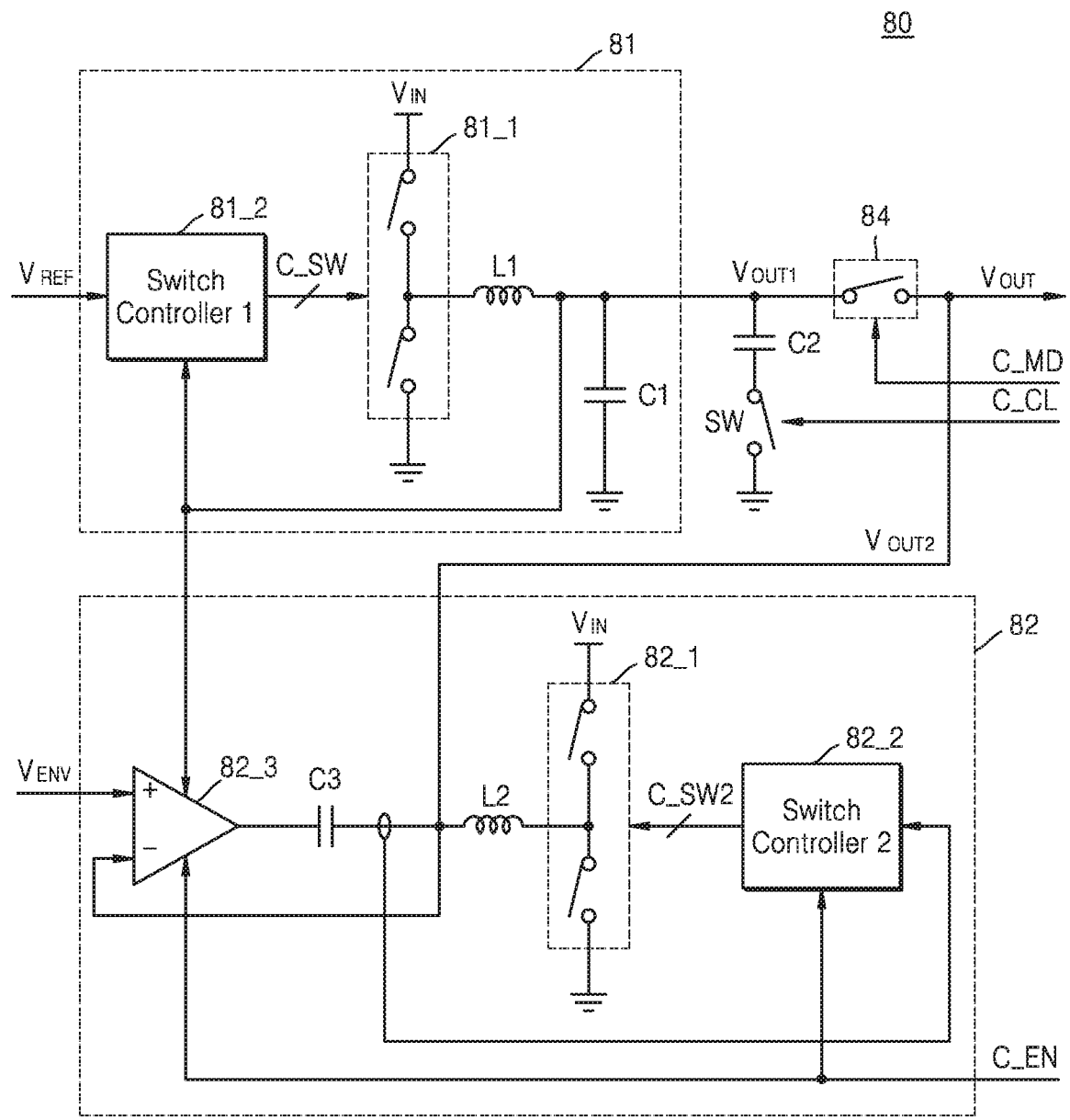
FIG. 8 is a circuit diagram illustrating an example of the power supply circuit of FIG. 7 according to an example embodiment.
Figure 9:
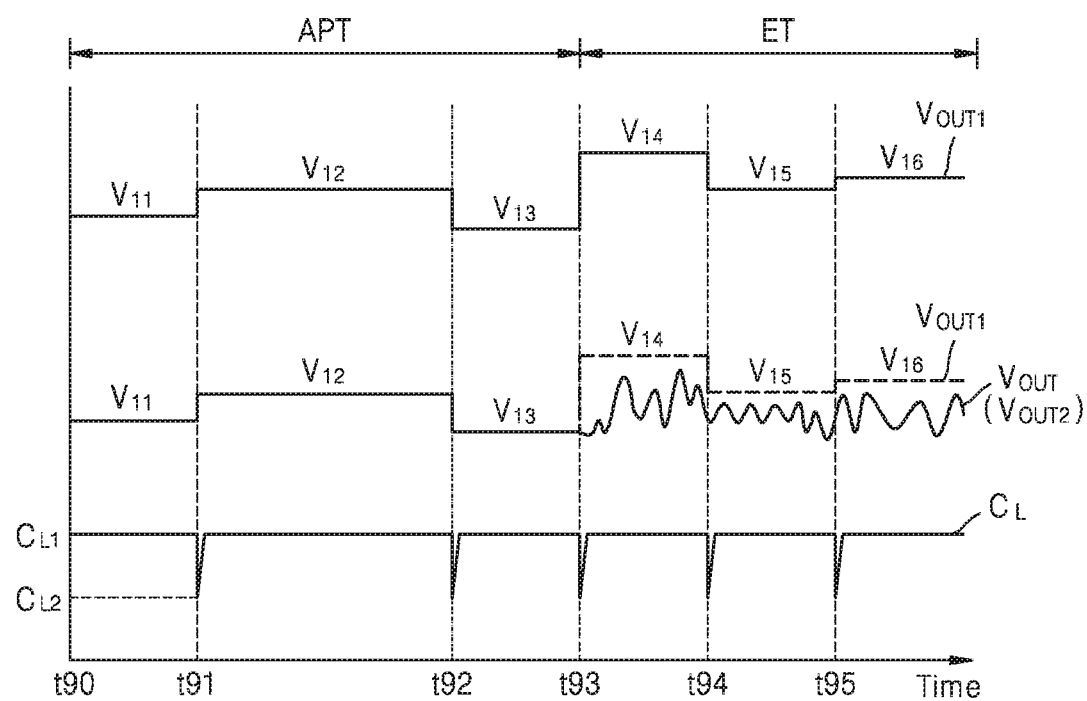
FIG. 9 is a graph illustrating an example of the operation of the power supply circuit of FIG. 8 based on the passage of time according to an example embodiment.

FIG. 8 is a circuit diagram illustrating an example of the power supply circuit 70 of FIG. 7 according to an example embodiment, and FIG. 9 is a graph illustrating an example of an operation of the power supply circuit 80 of FIG. 8 according to an example embodiment. Specifically, FIG. 8 shows an example of the first voltage regulator 71, the second voltage regulator 72, and the mode switch 74 of FIG. 7, and FIG. 9 shows the first output voltage $V_{OUT1}$, the second output voltage $V_{OUT2}$, the output voltage $V_{OUT}$, and the load capacitance $C_L$ of FIG. 8 based on the passage of time.

Referring to FIG. 8, a power supply circuit 80 may include a second capacitor C2, a switch SW, a first voltage regulator 81, a second voltage regulator 82, and a mode switch 84. The first voltage regulator 81 may generate the first output voltage $V_{OUT1}$ based on the reference voltage $V_{REF}$ and the second voltage regulator 82 may generate the second output voltage $V_{OUT2}$ based on the envelope voltage $V_{ENV}$. In the example of FIG. 8, the first voltage regulator 81 and the second voltage regulator 82 are illustrated as including a buck converter, but in some example embodiments, the first voltage regulator 81 and/or the second voltage regulator 82 may include a boost converter and/or a buck-boost converter.

The first voltage regulator 81 may include a first inductor L1, a first capacitor C1, a first switch circuit 81_1, and a first switch controller 81_2. The first switch controller 81_2 may generate a first switch control signal C_SW1 based on the reference voltage $V_{REF}$ and the first output voltage $V_{OUT1}$, and the first switch circuit 81_1 may supply a current to the first inductor L1 from the input voltage $V_{IN}$ or a current from the first inductor L1 to the ground voltage in response to the first switch control signal C_SW1. The first capacitor C1 may provide the load capacitance $C_L$ of the first voltage regulator 81. As described above with reference to FIGS. 4, 7, etc., the second capacitor C2 and the switch SW may change the load capacitance $C_L$ of the first voltage regulator 81 based on the capacitor control signal C_CL.

The second voltage regulator 82 may include a second inductor L2, a second switch circuit 82_1, and a second switch controller 82_2 and may further include a third capacitor C3 and an amplifier 82_3. The second inductor L2, the second switch circuit 82_1, and the second switch controller 82_2 in the second voltage regulator 82 may function as a buck converter, similar to the first voltage regulator 81, and the second voltage regulator 82 may take charge of the low frequency band of the second output voltage $V_{OUT2}$. In addition, the second switch controller 82_2 may receive a current flowing through the third capacitor C3 as a feedback and may generate the second switch control signal C_SW2 based on the feedback. This feedback of the current flowing through the third capacitor C3 is instead of the second output voltage $V_{OUT2}$ as a feedback like the first switch controller 81_2 of the first voltage regulator 81. The second switch controller 82_2 may receive an enable signal C_EN and may perform a normal operation in response to the activated enable signal C_EN, while the second switch controller 82_2 may be powered down in response to the inactivated control signal C_EN in some example embodiments.

The amplifier 82_3 may receive power from the first output voltage $V_{OUT1}$ and may include a non-inverting input for receiving an envelope voltage $V_{ENV}$ and an inverting input for receiving the second output voltage $V_{OUT2}$. An output signal of the amplifier 82_3 may be reflected to the second output voltage $V_{OUT2}$ through the third capacitor C3 and the third capacitor C3 may be referred to as an alternating current (AC) coupling capacitor. Accordingly, the amplifier 82_3 and the third capacitor C3 may take charge of the high frequency band of the second output voltage $V_{OUT2}$. The second switch controller 82_2 may receive an enable signal C_EN and may perform a normal operation in response to the activated enable signal C_EN, while the second switch controller 82_2 may be powered down in response to the inactivated control signal C_EN in some example embodiments.

The mode switch 84 may selectively connect an output node of the first voltage regulator 81 with an output node of the power supply circuit 80 based on a mode control signal C_MD. For example, the mode switch 84 may be turned on to output the first output voltage $V_{OUT1}$ as the output voltage $V_{OUT}$ in response to the mode control signal C_MD indicating the average power tracking mode, while the mode switch 84 may be turned off such that the output node of the first voltage regulator 81 is electrically disconnected from the output node of the power supply circuit 80 in response to the mode control signal C_MD indicating the envelope tracking mode. As illustrated in FIG. 8, the output voltage $V_{OUT}$ may coincide with the second output voltage $V_{OUT2}$, but the output voltage $V_{OUT}$ may be determined by the first output voltage $V_{OUT1}$ by disabling the second voltage regulator 82 in the average power tracking mode.

Referring to FIG. 9, from time t90 to time t93, the power supply circuit 80 may be set to the average power tracking mode. Accordingly, the output voltage $V_{OUT}$ may coincide with the first output voltage $V_{OUT1}$. In the average power tracking mode, the first voltage regulator 81 may dynamically change the level of the first output voltage $V_{OUT1}$ (V11→V12→V13), and the capacitance $C_L$ may be reduced while the level of the first output voltage $V_{OUT1}$ is changed. For example, at time t91, the load capacitance $C_L$ may be reduced from a first capacitance $C_{L1}$ to a second capacitance $C_{L2}$, and the load capacitance $C_L$ may be maintained at the second capacitance $C_{L2}$ while the level of the first output voltage $V_{OUT1}$ is changed (V11→V12). In some example embodiments, the load capacitance $C_L$ may be rapidly reduced from a first capacitance $C_{L1}$ to a second capacitance $C_{L2}$ and gradually increase from the second capacitance $C_{L2}$ to the first capacitance $C_{L1}$. Similarly, the load capacitance $C_L$ may be reduced at time t92 and time t93. Thus, as described above, the level of the first output voltage $V_{OUT1}$ may be quickly changed, while the noise (e.g., ripple) of the first output voltage $V_{OUT1}$ may decrease when the level of the first output voltage $V_{OUT1}$ is kept constant.

From time t93, the power supply circuit 80 may be set to the envelope tracking mode. Accordingly, the output voltage $V_{OUT}$, that is, the second output voltage $V_{OUT2}$, may be determined by the second voltage regulator 82. As described above with reference to FIG. 8, some components of the second voltage regulator 82, such as the amplifier 82_3, may receive power from the first output voltage $V_{OUT1}$ provided by the first voltage regulator 81, and the level of the first output voltage $V_{OUT1}$ may be dynamically changed according to a level of the second output voltage $V_{OUT2}$ (V14→V15→V16). Thus, similarly to the average power tracking mode, the load capacitance $C_L$ may be reduced while the level of the first output voltage $V_{OUT1}$ is changed. For example, as illustrated in FIG. 9, the load capacitance $C_L$ may be reduced to the second capacitance $C_{L2}$ at time t92, time t94, and time t95.

Figure 10:
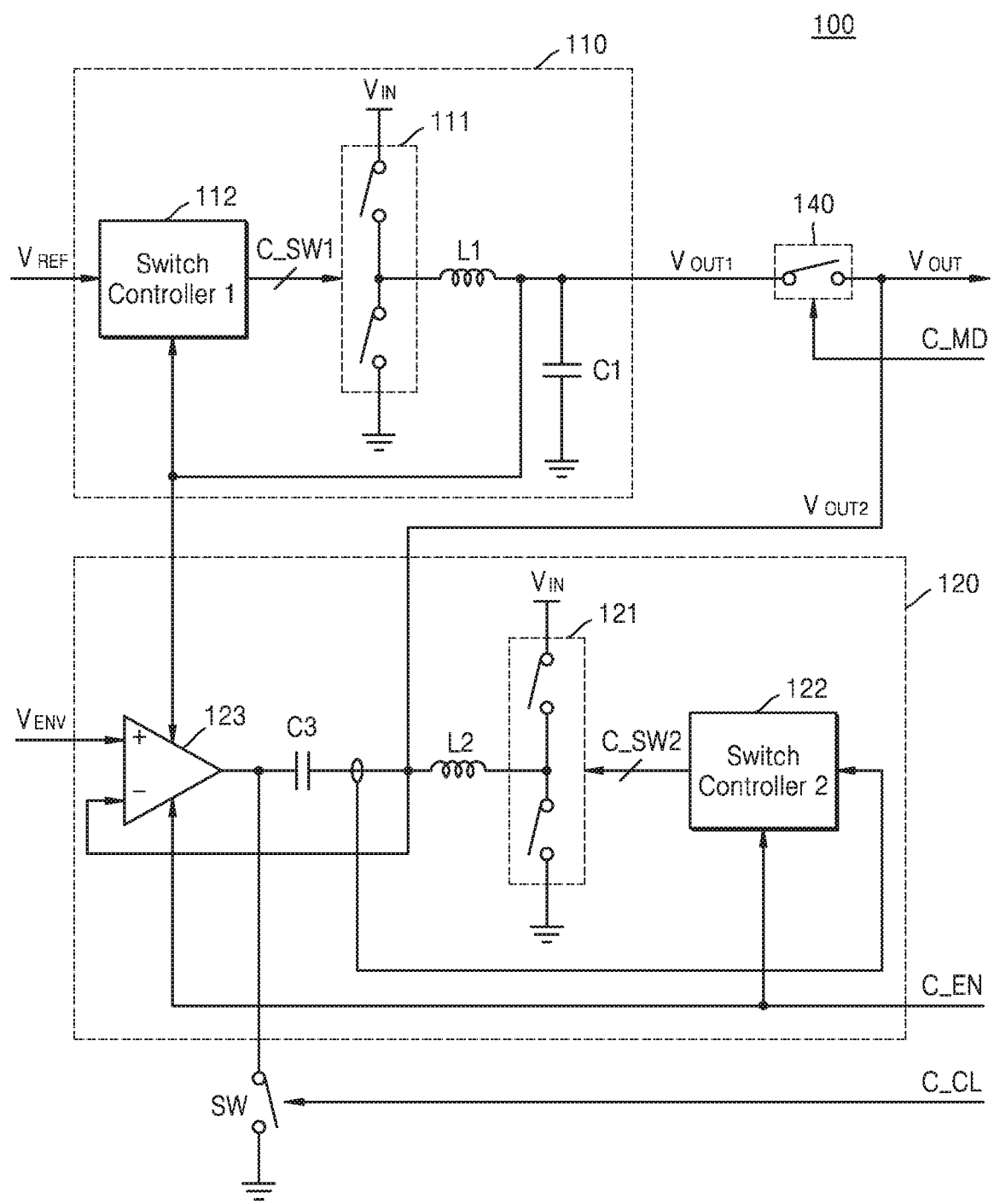
FIG. 10 is a circuit diagram illustrating an example of a power supply circuit according to an example embodiment.

FIG. 10 is a circuit diagram showing an example of a power supply circuit 100 according to an example embodiment. Specifically, comparing the power supply circuit 100 of FIG. 10 to the power supply circuit 80 of FIG. 8, the second capacitor C2 may be omitted for changing the load capacitance $C_L$ of the first voltage regulator 110. Hereinafter, the description overlapping with the description of FIG. 8 of the description of FIG. 10 will be omitted.

Referring to FIG. 10, the power supply circuit 100 may include a switch SW, a first voltage regulator 110, a second voltage regulator 120, and a mode switch 140. The first voltage regulator 110 may generate the first output voltage $V_{OUT1}$ based on the reference voltage $V_{REF}$ and may further include a first inductor L1, a first capacitor C1, a first switch circuit 111, and a first switch controller 112. The first switch controller 112 may generate a first switch control signal C_SW1 based on the reference voltage $V_{REF}$ and the first output voltage $V_{OUT1}$. The second voltage regulator 120 may generate the second output voltage $V_{OUT2}$ based on the envelope voltage $V_{ENV}$ and may further include the second inductor L2, the second switch circuit 121, the second switch controller 122, a third capacitor C3, and an amplifier 123. The second switch controller 122 may generate a second switch control signal C_SW2 based on a current flowing in the third capacitor C3.

Similarly to the switch SW of FIG. 8, the switch SW of FIG. 10 may change the load capacitance $C_L$ of the first voltage regulator 110 based on the capacitor control signal C_CL between the ground voltage and the first output voltage $V_{OUT1}$. Specifically, in FIG. 10, the switch SW may change the load capacitance $C_L$ by adding or excluding a capacitance of the third capacitor C3, which is the AC coupling capacitor of the second voltage regulator 120, to the load capacitance $C_L$. For example, in the average power tracking mode, the mode switch 140 may electrically couple an output node of the first voltage regulator 110 to an output node of the second voltage regulator 120 based on the mode control signal C_MD. Accordingly, one end of the third capacitor C3 may be electrically connected to the output node of the first voltage regulator 110. In addition, in the average power tracking mode, the amplifier 123 may have a floated output due to the deactivated enable signal C_EN. As a result, the third capacitor C3 may perform the same function as the second capacitor C2 in FIG. 8 in the average power tracking mode, and the switch SW may change the load capacitance $C_L$ by being turned on/off based on the capacitor control signal C_CL. In some example embodiments, the switch SW may be turned off in response to the capacitor control signal C_CL in the envelope tracking mode.

Figure 11:
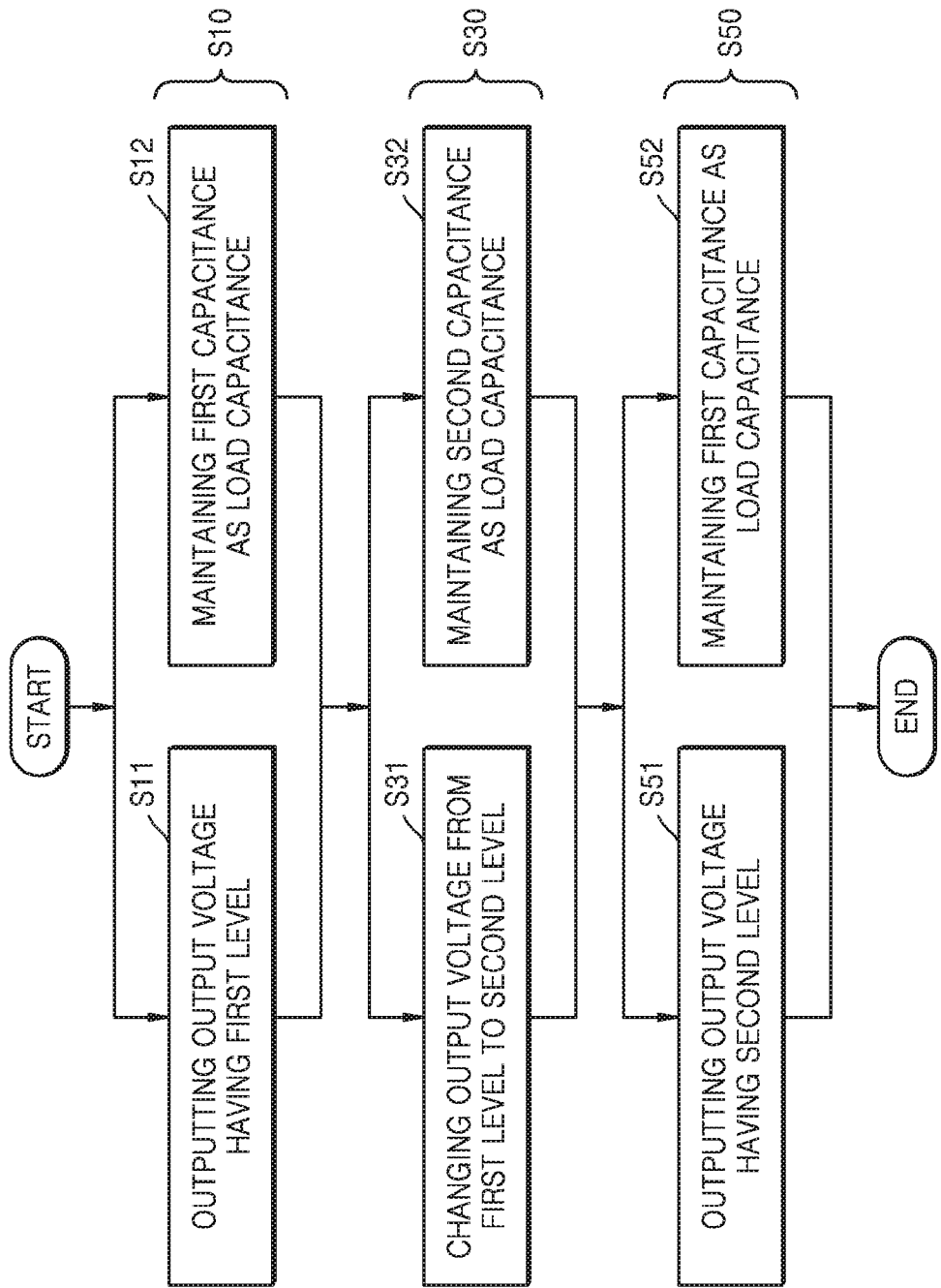
FIG. 11 is a flowchart illustrating a method of operating a switching regulator, according to an example embodiment.

FIG. 11 is a flowchart showing an operation method of a switching regulator according to an example embodiment. For example, the method of FIG. 11 may be performed by the switching regulator 10 of FIG. 1. As illustrated in FIG. 11, an operation method of a switching regulator may include step S10, step S30 and step S50. Hereinafter, FIG. 11 will be described with reference to FIGS. 1 and 2.

Step S10 may include steps S11 and S12, and in some example embodiments, steps S11 and S12 may be performed in parallel. In step S11, an operation of outputting the output voltage $V_{OUT}$ of the first level $V_1$ may be performed. For example, the switching regulator 10 may generate an output voltage $V_{OUT}$ of a first level $V_1$ based on the level of the reference voltage $V_{REF}$. In step S12, an operation of maintaining the load capacitance $C_L$ at the first capacitance $C_{L1}$ may be performed. For example, the capacitor circuit 13 may maintain the load capacitance $C_L$ at a first capacitance $C_{L1}$ higher than a second capacitance $C_{L2}$ in response to the capacitor control signal C_CL, and thus a noise of the output voltage $V_{OUT}$ may be reduced.

Step S30 may include steps S31 and S32, and in some example embodiments, steps S31 and S32 may be performed in parallel. In step S31, an operation of changing the output voltage $V_{OUT}$ from the first level $V_1$ to the second level $V_2$ may be performed. For example, the switching regulator 10 may change the output voltage $V_{OUT}$ from the first level $V_1$ to the second level $V_2$ in response to the level change of the reference voltage $V_{REF}$, and thus the output voltage $V_{OUT}$ may increase from the first level $V_1$ toward the second level $V_2$. In step S32, an operation of maintaining the second capacitance $C_{L2}$ as the load capacitance $C_L$ may be performed. For example, the capacitor circuit 13 may maintain the load capacitance $C_L$ at a second capacitance $C_{L2}$, which is less than the first capacitance $C_{L1}$, in response to the capacitor control signal C_CL, and thus the output voltage $V_{OUT}$ may be quickly changed from the first level $V_1$ to the second level $V_2$.

Step S50 may include steps S51 and S52, and in some example embodiments, steps S51 and S52 may be performed in parallel. In step S51, an operation of outputting the output voltage $V_{OUT}$ of the second level $V_2$ may be performed. For example, the switching regulator 10 may generate the output voltage $V_{OUT}$ of the second level $V_2$ based on the level of the reference voltage $V_{REF}$. In step S52, an operation of maintaining the load capacitance $C_L$ at the first capacitance $C_{L1}$ may be performed. For example, the capacitor circuit 13 may maintain the load capacitance $C_L$ at a first capacitance $C_{L1}$ higher than a second capacitance $C_{L2}$ in response to the capacitor control signal C_CL, and thus a noise of the output voltage $V_{OUT}$ may be reduced.

Figure 12:
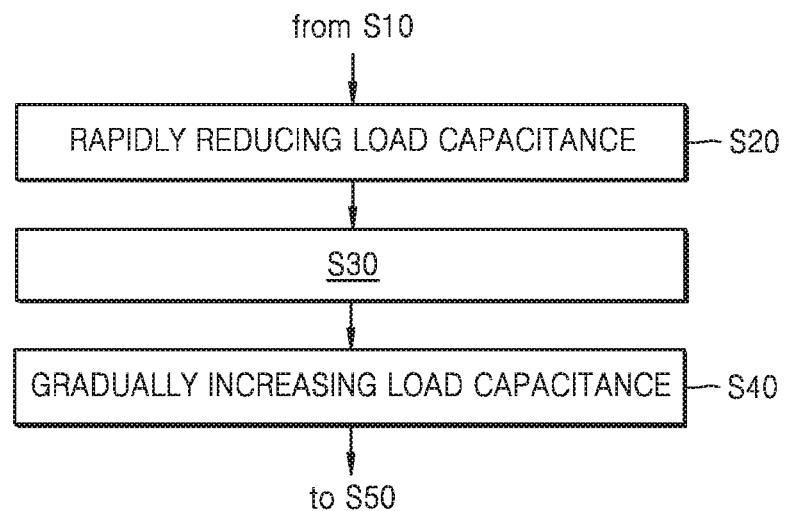
FIG. 12 is a flowchart illustrating a method of operating a switching regulator, according to an example embodiment.

FIG. 12 is a flowchart showing an operation method of a switching regulator according to an example embodiment. Specifically, FIG. 12 may further include steps S20 and S40 as compared to the method of FIG. 11. For example, a method of FIG. 12 may be performed by the switching regulator 10 of FIG. 1, and hereafter, FIG. 12 will be described with reference to FIGS. 1 and 5.

Following step S10 of FIG. 11, step S20 may be performed, and an operation of rapidly reducing the load capacitance $C_L$ may be performed in step S20. For example, in step S12 (included in step S10), the load capacitance $C_L$ may be held at the first capacitance $C_{L1}$, while in step S32 (included in step S30), the load capacitance $C_L$ may be maintained at the second capacitance $C_{L2}$. Thus, in step S20, the load capacitance $C_L$ may be rapidly reduced from the first capacitance $C_{L1}$ to the second capacitance $C_{L2}$, and thus the level of the output voltage $V_{OUT}$ may be rapidly changed from the beginning due to the rapidly reduced load capacitance $C_L$. Then, step S30 may be performed.

Following step S30, step S40 may be performed, and an operation of gradually increasing the load capacitance $C_L$ may be performed in step S40. For example, in step S32 (included in step S30), the load capacitance $C_L$ is maintained at the second capacitance $C_{L2}$, while in step S52 (included in step S50), the load capacitance $C_L$ may be maintained to the first capacitance $C_{L1}$. Accordingly, in step S40, the load capacitance $C_L$ may be gradually increased from the second capacitance $C_{L2}$ to the first capacitance $C_{L1}$, and thus the output voltage $V_{OUT}$ may stably have the second level $V_2$ when the change from the first level $V_1$ to the second level $V_2$ is completed.

Figure 13:
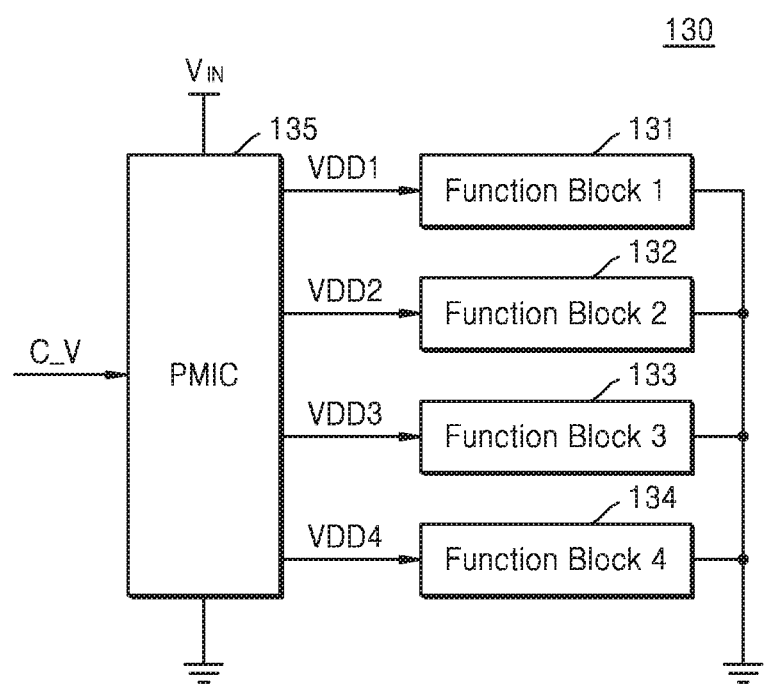
FIG. 13 is a diagram illustrating a system according to an example embodiment.

FIG. 13 is a diagram illustrating a system 130 according to an example embodiment. In some example embodiments, a system 130 may be one semiconductor integrated circuit such as a system-on-chip (SoC), or may include a printed circuit board and packages mounted thereto. As shown in FIG. 13, the system 130 may include first to fourth functional blocks 131 to 134 and a power management integrated circuit (PMIC) 135.

The first to fourth functional blocks 131 to 134 may operate based on a power supplied by first to fourth supply voltages VDD1 to VDD4 output from the PMIC 135. For example, at least one of the first to fourth functional blocks 131 to 134 may be a digital circuit for processing a digital signal, such as an application processor (AP), or may be an analog circuit for processing an analog signal such as an amplifier. In addition, at least one of the first to fourth functional blocks 131 to 134 may also be a circuit for processing a mixed signal such as an analog-to-digital converter (ADC). Although the system 130 is illustrated as including four functional blocks in FIG. 13, in some example embodiments, the system 130 may include fewer than four, five functional blocks or more than five functional blocks.

The PMIC 135 may generate the first to fourth supply voltages VDD1 to VDD4 from the input voltage $V_{IN}$ and may change a level of at least one of the first to fourth supply voltages VDD1 to VDD4 based on a voltage control signal C_V. At least one of the first to fourth functional blocks 131 to 134 may receive a dynamically varying level of supply voltage based on the required performance and power consumption. For example, the first functional block 131 may be an image processor that processes image data. While the first functional block 131 may receive the first supply voltage VDD1 at a low level while processing a photograph that includes a single image, the first functional block may receive the first supply voltage VDD1 at a higher level when the first functional block 131 processes a moving image including a series of images.

The PMIC 135 may receive the voltage control signal C_V corresponding to the performance and power consumption required in the first functional block 131, and the PMIC 135 may increase or decrease the level of the first supply voltage VDD1 based on the voltage control signal C_V. As such, the method of dynamically changing the level of the supply voltage of the functional block may be referred to as dynamic voltage scaling (DVS). The PMIC 135 may include the switching regulator described above with reference to the drawings, and thus the first supply voltage VDD1 may have reduced noise when a constant level is maintained, while the level of the first supply voltage VDD1 may be quickly changed. In some example embodiments, the first functional block 131 may stop an operation while the level of the first supply voltage VDD1 is changed, and may resume the operation after the level of the first supply voltage VDD1 has changed. Accordingly, when the level of the first supply voltage VDD1 is changed quickly, the execution time of the operation by the first functional block 131 may be shortened, and as a result, the system 130 may provide the improved performance. In addition, due to the reduced noise of the first power supply voltage VDD1, the operational reliability of the first functional block 131 and the system 130 may be improved.

Figure 14:
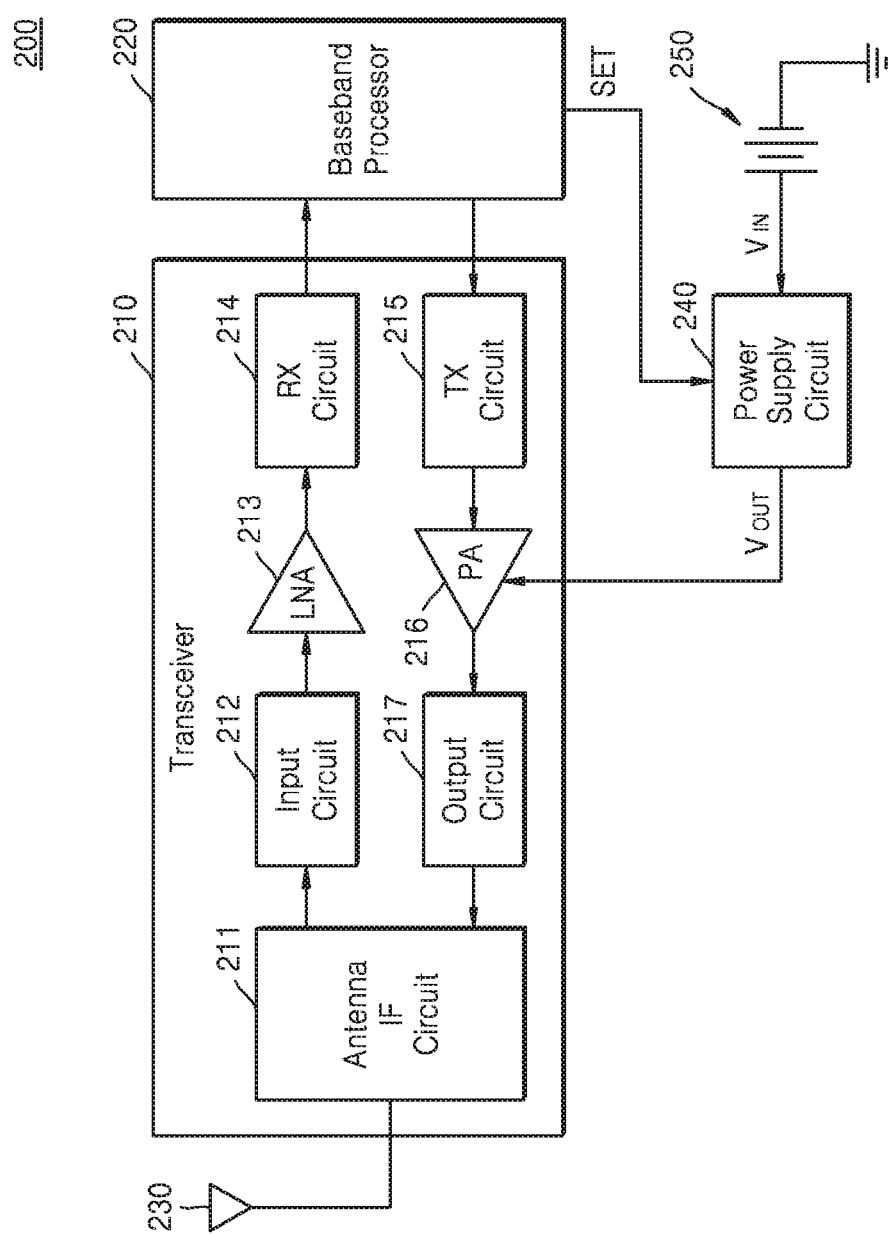
FIG. 14 is a block diagram illustrating a wireless communication device according to an example embodiment.

FIG. 14 is a block diagram illustrating a wireless communication device 200 according to an example embodiment. Specifically, FIG. 14 shows a user equipment (UE) (or terminal) to which power is supplied by a battery 250. The wireless communication device 200 may, in some example embodiments, be included in a wireless communication system using a cellular network such as 5G, LTE, or may be included in a wireless local area network (WLAN) or any other wireless communication system. In a wireless communication device 200, a switching regulator according to an example embodiment may be used to provide variable power to a power amplifier 216. As illustrated in FIG. 14, the wireless communication device 200 may include a transceiver 210, a baseband processor 220, an antenna 230, a power supply circuit 240, and a battery 250.

The transceiver 210 may include an antenna interface circuit 211, an input circuit 212, a low noise amplifier (LNA) 213, a receive circuit 214, a transmit circuit 215, a power amplifier (PA) 216, and an output circuit 217. The antenna interface circuit 211 may couple the transmitter or the receiver with the antenna 230 according to a transmission mode or a reception mode. In some example embodiments, the input circuit 212 may include a matching circuit or filter, the low noise amplifier 213 may amplify an output signal of the input circuit 212, and the receive circuit 214 may include a mixer for down-conversion. In some example embodiments, the transmit circuit 215 may include a mixer for up-conversion, the power amplifier 216 may amplify an output signal of the transmit circuit 215, and the output circuit 217 may include a matching circuit or a filter.

The baseband processor 220 may transmit and receive signals of the baseband with the transceiver 210, and may perform modulation/demodulation, encoding/decoding, and the like. In some example embodiments, the baseband processor 220 may be referred to as a modem. The baseband processor 220 may generate a set signal SET for setting the average power tracking mode or the envelope tracking mode and may generate a set signal SET for changing the level of the output voltage $V_{OUT}$.

The power supply circuit 240 may receive the input voltage $V_{IN}$ from the battery 250 and may generate an output voltage $V_{OUT}$ that provides power to the power amplifier 216. The power supply circuit 240 may include the switching regulator described above with reference to the drawings and may change the load capacitance $C_L$ based on the set signal SET to enable a rapid level change of the output voltage $V_{OUT}$ and a stable level.

As described above, example embodiments have been disclosed in the drawings and specification. While example embodiments have been described herein with reference to specific terms, it should be understood that they have been used only for the purpose of describing the technical idea and not for limiting the scope of the present disclosure as defined in the claims. Therefore, those skilled in the art will appreciate that various modifications are possible without departing from the scope of the present disclosure. Accordingly, the true scope of protection should be determined by the technical idea of the appended claims.

What is claimed is:

1. A switching regulator configured to generate an output voltage based on an input voltage, the switching regulator comprising:
   an inductor; and
   a capacitor circuit configured to generate the output voltage by charging an inductor current passing through the inductor from the input voltage, provide a first capacitance as a load capacitance based on the output voltage being a first level, provide the first capacitance as the load capacitance based on the output voltage being a second level, and provide a second capacitance, which is less than the first capacitance, as the load capacitance based on the output voltage being between the first level and the second level,
   wherein the capacitor circuit comprises:
      a first capacitor configured to provide a fixed capacitance between a ground voltage and the output voltage; and
      a variable capacitor connected in parallel with the first capacitor between the ground voltage and the output voltage,
   wherein the fixed capacitance of the first capacitor is the second capacitance, and
   wherein the variable capacitor comprises:
      a second capacitor having a capacitance corresponding to a difference between the first capacitance and the second capacitance; and
      a switch coupled in series with the second capacitor that is configured to electrically disconnect the second capacitor from the ground voltage based on a control signal.

2. The switching regulator of claim 1, wherein the capacitor circuit is configured to gradually change the load capacitance from the second capacitance to the first capacitance for a certain period from a point in time based on the output voltage reaching the second level from the first level.

3. The switching regulator of claim 2, wherein the capacitor circuit is configured to be charged or discharged by a current of a constant magnitude during the certain period.

4. The switching regulator of claim 1, wherein the capacitor circuit is configured to rapidly change the load capacitance from the first capacitance to the second capacitance at a point in time based on the output voltage beginning to change from the first level to the second level.

5. The switching regulator of claim 1, wherein the switch comprises a transistor connected between the second capacitor and the ground voltage and comprising a control terminal configured to receive the control signal.

6. The switching regulator of claim 1, wherein the switch comprises a current source configured to draw current from the second capacitor based on the control signal.

7. The switching regulator of claim 1, wherein the switch comprises a resistance circuit between the second capacitor and the ground voltage that is configured to provide a variable resistance value based on the control signal.

8. The switching regulator of claim 1, wherein the capacitor circuit is configured to provide the second capacitance based on the output voltage changing from the second level to the first level.

9. The switching regulator of claim 8, wherein the capacitor circuit is configured to gradually change the load capacitance from the second capacitance to the first capacitance for a certain period of time from a point in time based on the output voltage reaching the first level from the second level.

10. The switching regulator of claim 1, further comprising:
    a switch circuit configured to selectively provide the inductor current to the capacitor circuit; and
    a switch controller configured to control the switch circuit based on a reference voltage and the output voltage.

11. A switching regulator configured to generate an output voltage based on an input voltage, the switching regulator comprising:
    an inductor; and
    a capacitor circuit configured to provide a load capacitance, generate the output voltage by charging an inductor current passing through the inductor from the input voltage, and rapidly change the load capacitance from a first capacitance to a second capacitance that is less than the first capacitance and gradually change the load capacitance from the second capacitance to the first capacitance based on the output voltage.

12. The switching regulator of claim 11, wherein the capacitor circuit is configured to provide the first capacitance as the load capacitance based on the output voltage being a first level or a second level, and provide the second capacitance based on the output voltage being between the first level and the second level.

13. A power supply circuit configured to generate a supply voltage based on an input voltage, the power supply circuit comprising:
    a first voltage regulator configured to generate a first output voltage based on the input voltage and a reference voltage;
    a switch configured to change a load capacitance between a ground voltage and the first output voltage based on a control signal; and
    a power controller configured to generate the reference voltage to control the first voltage regulator to change the first output voltage according to a load condition and generate the control signal to control the switch to maintain the load capacitance at a first capacitance based on the first output voltage being constant and maintain the load capacitance at a second capacitance that is less than the first capacitance based on the first output voltage changing.

14. The power supply circuit of claim 13, further comprising a second voltage regulator configured to generate a second output voltage based on the first output voltage and an envelope voltage, wherein the power controller is configured to disable the second voltage regulator in an average power tracking mode and enable the second voltage regulator in an envelope tracking mode.

15. The power supply circuit of claim 14, further comprising a mode switch connected to the first voltage regulator and the second voltage regulator, wherein the power controller is configured to control the mode switch such that the first output voltage is output as the supply voltage in the average power tracking mode and the second output voltage is output as the supply voltage in the envelope tracking mode.

16. The power supply circuit of claim 14, wherein the second voltage regulator comprises:

an amplifier configured to amplify a difference between the envelope voltage and the second output voltage; and an alternating current coupling capacitor coupled to an output of the amplifier, wherein the switch is connected to one end of the alternating current coupling capacitor and is configured to add or remove a capacitance of the alternating current coupling capacitor to or from the load capacitance based on the control signal.

17. The power supply circuit of claim 16, wherein, the amplifier is powered based on the first output voltage in the envelope tracking mode.

18. The power supply circuit of claim 16, wherein the switch is configured to, based on the control signal, rapidly change the load capacitance from the first capacitance to the second capacitance and gradually change the load capacitance from the second capacitance to the first capacitance.

* * * * *